(12) United States Patent
Bottomley

(10) Patent No.: US 7,088,104 B2
(45) Date of Patent: Aug. 8, 2006

(54) MRI TUNABLE ANTENNA AND SYSTEM

(75) Inventor: Paul Bottomley, Columbia, MD (US)

(73) Assignee: The John Hopkins University, Baltimore, MD (US)

( * ) Notice: Subject to any disclaimer, the term of this patent is extended or adjusted under 35 U.S.C. 154(b) by 84 days.

(21) Appl. No.: 10/500,440

(22) PCT Filed: Dec. 31, 2002

(86) PCT No.: PCT/US02/41901

§ 371 (c)(1),
(2), (4) Date: Oct. 28, 2004

(87) PCT Pub. No.: WO03/058283

PCT Pub. Date: Jul. 17, 2003

(65) Prior Publication Data

US 2005/0062472 A1 Mar. 24, 2005

Related U.S. Application Data

(60) Provisional application No. 60/345,917, filed on Dec. 31, 2001.

(51) Int. Cl.
*G01V 3/00* (2006.01)
(52) U.S. Cl. ..................... 324/328; 324/322
(58) Field of Classification Search ............... 324/318, 324/322
See application file for complete search history.

(56) References Cited

U.S. PATENT DOCUMENTS

| 3,789,832 A | 2/1974 | Damadian ................... 128/2 R |
| 4,638,253 A | 1/1987 | Jakolksi et al. ............. 324/311 |
| 4,751,464 A | 6/1988 | Bridges ....................... 324/318 |
| 4,783,641 A | 11/1988 | Hayes et al. ................ 333/219 |
| 4,825,162 A | 4/1989 | Roemer et al. ............. 324/318 |
| 4,968,937 A | 11/1990 | Akgun ....................... 324/318 |
| 5,017,872 A | 5/1991 | Foo et al. ................... 324/322 |
| 5,212,450 A | 5/1993 | Murphy-Boesch et al. . 324/322 |
| 5,270,656 A | 12/1993 | Roberts et al. ............. 324/318 |
| 5,363,845 A | 11/1994 | Chowdhury et al. ..... 128/653.5 |
| 5,365,172 A | 11/1994 | Hrovat et al. ............... 324/309 |
| 5,367,261 A | 11/1994 | Frederick .................... 324/318 |
| 5,467,017 A | 11/1995 | Duerr et al. ................ 324/318 |

(Continued)

OTHER PUBLICATIONS

Wright, et al., "Arrays of Mutually Coupled Receiver Coils: Theory and Application", Magnetic Resonance in Medicine 17, 252-268 (1991).

(Continued)

*Primary Examiner*—Louis M. Arana
(74) *Attorney, Agent, or Firm*—Peter F. Corless; William J. Daley, Jr.; Edwards, Angell, Palmer & Dodge LLP

(57) ABSTRACT

A strip array antenna including a number of conductors (14) that are connected to ground or virtual ground though at least one reactive component (150). The apparent electrical length of conductors (140) is tuned so that it equals an integer multiple of a quarter wavelength at the operating frequency.

79 Claims, 12 Drawing Sheets

U.S. PATENT DOCUMENTS

| | | | |
|---|---|---|---|
| 5,523,689 A | 6/1996 | Oppelt et al. | 324/318 |
| 5,621,322 A | 4/1997 | Ehnholm | 324/318 |
| 5,642,048 A | 6/1997 | Crozier et al. | 324/318 |
| 5,744,957 A | 4/1998 | Vaughan, Jr. | 324/318 |
| 5,898,306 A | 4/1999 | Liu et al. | 324/318 |
| 5,910,728 A | 6/1999 | Sodickson | 324/309 |
| 5,990,681 A | 11/1999 | Richard et al. | 324/318 |
| 5,998,999 A | 12/1999 | Richard et al. | 324/318 |
| 6,169,401 B1 | 1/2001 | Fujita et al. | 324/318 |
| 6,236,206 B1 | 5/2001 | Hartman et al. | 324/318 |
| 6,252,403 B1 | 6/2001 | Alsop | 324/318 |
| 6,285,189 B1 | 9/2001 | Wong | 324/318 |
| 6,316,941 B1 | 11/2001 | Fujita et al. | 324/318 |
| 6,396,271 B1 | 5/2002 | Burl et al. | 324/318 |
| 6,420,871 B1 | 7/2002 | Wong et al. | 324/318 |
| 6,727,703 B1 * | 4/2004 | Lee | 324/322 |
| 6,771,070 B1 * | 8/2004 | Lee | 324/318 |
| 6,982,554 B1 * | 1/2006 | Kurpad et al. | 324/318 |

OTHER PUBLICATIONS

Roemer, et al., "The NMR Phased Array", Magnetic Resonance in Medicine 16, 192-225 (1990).

Vaughan, et al., "High Frequency Volume Coils for Clinical NMR Imaging and Spectroscopy", MRM 32:206-218 (1994).

* cited by examiner

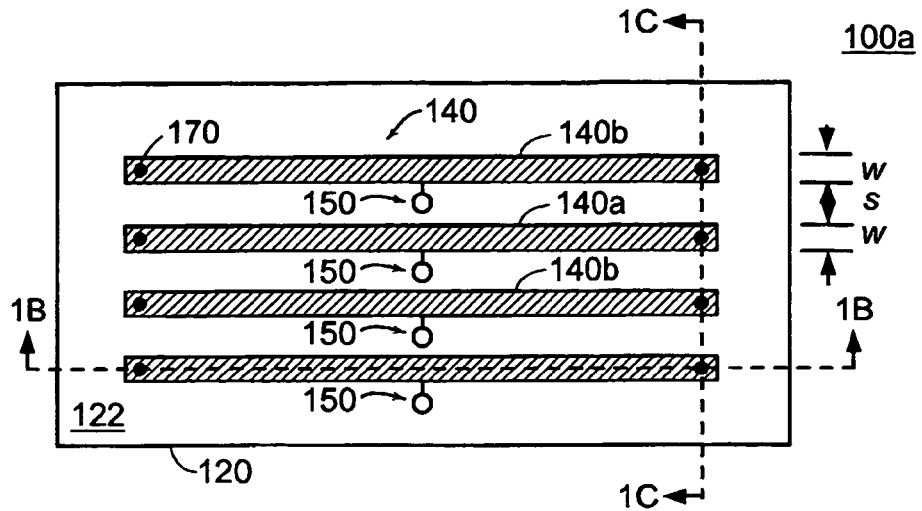
FIG. 1A
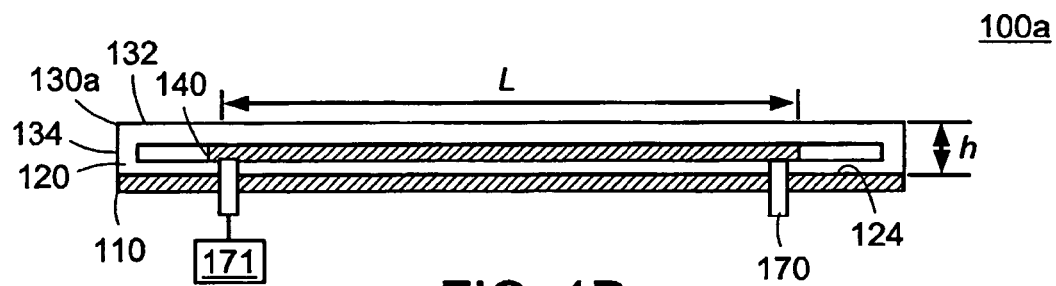
FIG. 1B
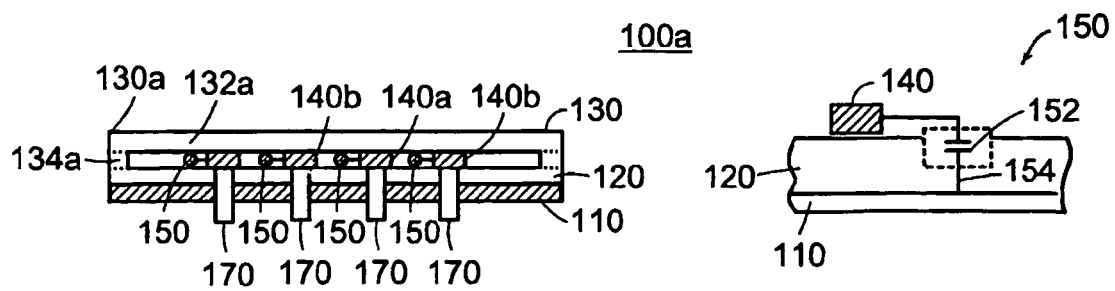 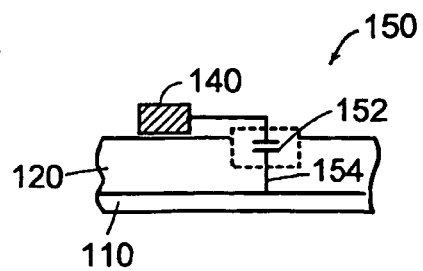
FIG. 1C      FIG. 1D

MRI TUNABLE ANTENNA AND SYSTEM

This application also claims the benefit of U.S. Provisional Application Ser. No. 60/345,917 filed Dec. 31, 2001, the teaching of which are incorporated herein by reference.

FIELD OF INVENTION

The present invention generally relates to apparatus and methods for nuclear magnetic resonance (NMR), magnetic resonance (MR) imaging (MRI), and magnetic resonance spectroscopy (MRS). More particularly the present invention relates to an apparatus having a tunable near-field radio-frequency strip array antenna that can be used for conventional NMR, conventional spatially encoded MRI or MRS and parallel spatial encoded MRI. The present invention also relates to methods and NMR, MRI or MRS systems related thereto.

BACKGROUND OF THE INVENTION

Magnetic resonance imaging (MRI) is a technique that is capable of providing three-dimensional imaging of an object. A conventional MRI system typically includes a main or primary magnet that provides the main static magnetic field $B_o$, magnetic field gradient coils and radio frequency (RF) coils, which are used for spatial encoding, exciting and detecting the nuclei for imaging. Typically, the main magnet is designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,689,563; 4,968,937 and 5,990,681, the teachings of which are incorporated herein by reference, some exemplary MRI systems.

In MRI, the uniform magnetic field $B_o$ generated by the main magnet is applied to an imaged object by convention along the Z-axis of a Cartesian coordinate system, the origin of which is within the imaged object. The uniform magnetic field $B_o$ being applied has the effect of aligning the magnetization arising from the nuclei of the atoms comprising the imaged object, along the Z-axis, such nuclei possess a nuclear magnetization due to their having an odd number of protons or neutrons. In response to RF magnetic field pulses of the proper frequency, with field direction orientated within the XY plane, the nuclei resonate at their Larmor frequencies, $\omega = \gamma B_o$ where $\gamma$ is called the gyromagnetic ratio. In a typical planar imaging sequence, the RF signal centered about the desired Larmor frequency is applied to the imaged object at the same time a magnetic field gradient $G_x$ is being applied along the Z-axis. This gradient field $G_x$ causes only the nuclei in a slice of limited thickness through the object perpendicular to the Z-axis, to satisfy the resonant condition and thus be excited into resonance.

After excitation of the nuclei in the slice, magnetic field gradients are applied along the X- and Y-axes respectively. The gradient $G_x$ along the X-axis causes the nuclei to precess at different frequencies depending on their position along the X-axis, that is, $G_x$ spatially encodes the precessing nuclei by frequency. Thus, this gradient is often referred to as a frequency encoding or read-out gradient. The Y-axis gradient $G_y$ is incremented through a series of values and encodes the Y position into the rate of change of the phase of the precessing nuclei as a function of gradient amplitude, a process typically referred to as phase encoding.

The quality of the image produced by the MRI techniques is dependent, in part, upon the strength of the magnetic resonance (MR) signal received from the precessing nuclei. For this reason an independent RF coil is often placed in close proximity to the region of interest of the imaged object, more particularly on the surface of the imaged object, in order to improve the strength of the received signal. Such RF coils are sometimes referred to as local coils or surface coils.

There is described in U.S. Pat. No. 4,825,162 a surface coil(s) for use in MRI/NMRI imaging and methods related thereto. In the preferred embodiment of that invention, each surface coil is connected to the input of an associated one of a like plurality of low-input-impedance preamplifiers, which minimize the interaction between any surface coil and any other surface coils not immediately adjacent thereto. These surface coils can have square, circular and the like geometries. This yields an array of a plurality of closely spaced surface coils, each positioned so as to have substantially no interaction with all adjacent surface coils. A different MR response signal is received at each different one of the surface coils from an associated portion of the sample enclosed within the imaging volume defined by the array. Each different MR response signal is used to construct a different one of plurality of different images from each surface coil. These images are then being combined, on a point-by-point basis to produce a single composite MR image of a total sample portion comprised of the MR response signals from the entire array of surface coils.

The use of a phased array of RF coils or surface coils with a tuned and matched circuit including low impedance preamplifiers have been used to de-couple adjacent loops as a mechanism for improving the signal-to-noise ratio (SNR) and field of view (FOV). In this regard, it should be understood that the term "coupling" refers to the coupling of a signal (e.g., MR signal and/or noise signal and/or RF excite signal) in one coil to an adjacent coil(s), such that the signal being outputted by the adjacent coil is a combination of the signal detected by the adjacent coil and the coupled signal. Consequently, the image from the adjacent coil may be distorted or the SNR degraded to some degree. Although overlapping adjacent coil(s) and using low impedance preamplifiers have been effective in minimizing decoupling artifacts and SNR degradation, such circuitry becomes less effective as the number of coils and/or the coil density is increased. In particular, as the spacing between adjacent coils and between adjacent portions of a coil is decreased signal coupling effects increase and become less manageable by the various measures deployed to counter such effects.

Although there are a variety of spatial encoding methodologies or techniques being implemented, a popular method used in commercial MRI scanners is two-dimensional Fourier transform (2DFT) encoding in which a two-dimensional spatial plane (e.g., XY plane) is first selectively excited then encoded with both frequency and phase of the MR signals. Typically during one data acquisition, only a one dimensional time-domain signal is obtained from the plane and the 2DFT encoding requires repeating the data acquisitions sequentially to achieve a pseudo second dimension of the time domain signals. This second dimension of spatial information is encoded by repeating the data acquisition with different phase encoding gradient strengths (i.e., varying $G_y$ to create the pseudo-time dimension). The spatial resolution in the Y-direction or axis generally corresponds to the FOV divided by the number of different gradient strengths used (e.g., 128, 256). The number of different gradient phase-encoding steps also generally corresponds to the number of pixels in the Y-direction. The spatial information in the X-direction is encoded in the time-domain signal that is acquired in the presence of the constant frequency-encoding, or readout, gradient. Because the spatial resolution depends in part on the number of repetitions and therefore the number of phase-encoding steps, and because the repetition rate is limited by the MR relaxation times; a higher resolution image generally takes a longer time.

Two recent methods, the Simultaneous Acquisition of Spatial Harmonics (SMASH) imaging in the time domain and the Sensitivity Encoded (SENSE) imaging in the frequency domain, replace such sequential data acquisition by a partially parallel process by using a multi-channel phased array detector system, thereby reducing the scan time as compared to the sequential data acquisition technique. In these two techniques, it is recognized that the data lost by sampling below the Nyquist sampling rate can be recovered using the spatial information intrinsically contained in the sensitivity profiles of the individual detectors that comprise the phased array.

Thus, the time domain method (SMASH) recognizes the equivalence between phase-encoding with MRI gradients and the composite spatial harmonics that are present in the detector sensitivity profiles. It uses a numerical fitting routine to recreate a number (i.e., usually a limited number) of phase-encoding steps from the profiles, and thus permits reductions in scan time by allowing the number of conventional phase encoding steps to be reduced by the number of steps that can be so recreated. Although this numerical approach was instrumental in demonstrating the original SMASH concept, it did not recognize the underlying analytical relationship between the weighting factors for the composite harmonics, the FOV, the spacing of the detectors, the harmonic orders, and the sensitivity profiles of the detector coils, which was addressed subsequently by the Analytic SMASH Procedure (ASP), described in Lee et al, Magn Reson Med 2000; 43: 716–725. See also U.S. Ser. No. 09/728,948 entitled "Method for Parallel Spatial Encoded MRI and Apparatus, Systems and other Methods Related Thereto, the teachings of which are incorporated herein by reference, owned by the Assignee of the present invention.

A problem with all of these methods (SMASH, SENSE, ASP, etc.) is that conventional MRI phased array coils are limited in the number of coils that can be deployed, by the limitations imposed by both their loop structure and the de-coupling requirements for the mutual induction between the elements. Because the number of coils in the phased array correlates to the maximum factor for reducing the number of phase encoding steps, existing phased array designs significantly limit the potential for parallel spatial encoding.

There is found in U.S. Ser. No. 09/822,771 entitled "APPARATUS FOR MAGNETIC RESONANCE IMAGING HAVING A PLANAR STRIP ARRAY ANTENNA INCLUDING SYSTEMS AND METHODS RELATED THERETO" (owned by the assignee of the subject patent application) a new type of phased-array detector, a planar strip array (PSA). The PSA includes an array of parallel conductive strips that are disposed on one surface of a substrate and on the other opposing surface thereof is disposed a ground plane. An overlay is applied so as to cover the conductors disposed on the substrate. Each of the conductor strips has a length that is set so as to substantially reduce the coupling of a signal in one of the conductors to an adjacent conductor. More particularly, the conductor length is set so as to be equal to be about $n\lambda/4$, where n is an integer $\geq 1$ and $\lambda$ is the electromagnetic (EM) wavelength of the signal to be detected from a sample placed on top. For MRI applications, $\lambda$ is the wavelength in the detector corresponding to the NMR resonance frequency for the nuclei in the sample being subjected to a given magnetic field strength by the main or primary magnetic coils. The materials comprising the overlay and the substrate are comprised of a material whose relative permittivity material is chosen to result in an EM wavelength such that the quarter wavelength (or $n\lambda/4$) condition produces a detector whose length is reasonable relative to the sample or image FOV.

Under these conditions, the behavior of the PSA is such that it provides decoupling of adjacent and neighboring elements or conductive strips. Unlike loop coils, the conductive strips are inherently decoupled to a certain extent regardless of their spacing from each other, and are broadband decoupled when the spacing "s" and the total thickness "h" of the substrate and overlay approximately satisfy the relation $s \geq 2.5h$. Because the electrical field is concentrated between the conductive strips and the ground plane, losses associated with the electrical field are minimized. Thus, the PSA structure is capable of accommodating a large number of detectors for simultaneously acquiring near-field MRI signals without interference between each other, and is ideally suited to conventional phased-array MRI or parallel sensitivity encoded MRI. Although the PSA has made important and significant advances with regards to decoupling of adjacent conductive strips or elements, there is a continuing need to improve upon the capabilities of a parallel conductive strip array. More particularly, there also is a need to expand upon the capabilities of the PSA teachings so a parallel conductive strip array (e.g., configuration and size) can be optimized for various anatomies and organs of interest, such as can be done with conventional loop arrays. Also, it would be desirable to expand upon the capabilities of the PSA teachings so a parallel conductive strip array has a non-planar, cylindrical geometry for applications for the head, limbs or other generally cylindrically shaped objects as well as having a curved geometry so that the array conforms to the general contour of the object to be sampled, for example a body.

It thus would be desirable to provide an array antenna or RF MR signal detector, as well as systems and methods embodying such an antenna/detector, in which adjacent antenna or conducting elements are decoupled and which array antenna is tunable to any of a number of MRI frequencies. It also would be desirable to provide such an array antenna or RF MR signal detector, as well as systems and methods embodying such an antenna/detector, where the length of the conducting elements can be selected based on MR performance criteria specific to the geometry of the sample and region of interest or organs to be imaged. More particularly, it would be desirable to provide such an array antenna or RF MR signal detector, as well as systems and methods embodying such an antenna/detector, where the length of the conducting elements can be adjusted to allow one to optimize SNR performance for a specific depth or range of depths in the body or sample being scanned. In addition, it would be desirable to provide such an array antenna or RF MR signal detector in which there is a reduced sensitivity variation as a function of position along the conducting elements. Further, it would be particularly desirable to provide such an array antenna or RF MR signal detector, as well as systems and methods embodying such an antenna/detector, that embodies a non-planar geometrical configuration, more specifically a cylindrical geometrical configuration. In addition, it would be desirable to provide such an array antenna/detector, system and method in which the array antenna includes a plurality or more, more particularly a multiplicity, of elements for detecting MR signals, such as 4 or more, 16 or more, 32 or more or 64 or more elements so as to significantly reduce scan time, particularly when the array is in conjunction with parallel sensitivity encoding methods, such as SMASH, SENSE, ASP and the like. Such an array antenna/MR signal detector preferably would be simple in construction as compared to prior art loop phased array antennas and/or MR signal detectors.

SUMMARY OF THE INVENTION

The present invention features a device for detecting or receiving magnetic resonance (MR) signals and more particularly a device for detecting nuclear magnetic resonance (NMR) signals from excited nuclei. Also featured are a detection apparatus embodying such a device, an MR excitation and signal detection apparatus embodying such a device, a magnetic resonance imaging (MRI) system embodying such a device and/or such an MR excitation and signal detection apparatus. Further featured are methods related to the above-described detection device, apparatuses and system.

The detection device includes a strip array antenna including at least one, and preferably a plurality of conductors being arranged so as to be generally parallel to each other and a plurality of reactive components or elements, such reactive components or elements including for example a capacitor, an inductor or both. At least one of the plurality of reactive components is electrically coupled to each conductor and to one of ground or a virtual ground. Each of the conductors has a length and each of the reactive components has a value set so that the combination of the conductor length and the reactance of the reactive component is such as to substantially reduce the coupling of a signal in one of the conductors to an adjacent conductor.

More particularly, the reactance value of the reactive component value is set or tuned so that the effective electrical length of each conductor is substantially equal to be about $n\lambda/4$, where n is an integer $\geq 1$ and $\lambda$ is the EM wavelength of the signal to be detected by each conductor in combination with the at least one reactive component. For MRI applications, $\lambda$ is the wavelength corresponding to the NMR frequency for the nuclei being subjected to a given magnetic field strength by the main or primary magnetic coils. For example, the quarter wavelength for a proton NMR in a 1.5 Telsa magnetic field in air is about 117 cm, which reduces to about 46 cm in a glass dielectric PSA (see Lee et al, Magn Reson Med 2001; 45: 673–683), and is effectively reduced and/or adjusted further in the conductor strips of the present invention through the use of the reactive components.

In a more particular embodiment, the length of each conductor also is established so as to optimize the NMR performance of the array for the particular geometry and size of the sample, sub-region of the sample, region of interest or organ to be imaged and the strip array antenna is configured and arranged so as to substantially reduce coupling of signals between adjacent conductors. In this way, the conductor length is set so NMR performance is optimized for the region of interest through the use of the reactive component, whose values are set such as to tune the chosen length of the conductor so as to be electrically equal to about $n\lambda/4$, to thereby substantially reduce signal coupling. Thus, and in an exemplary embodiment, the length of the conductor can be reduced so as to be on the order of from about 10 to 30 cm, dimensions that are comparable to the body or depth of specific organs of interest, while the reactance of the reactive components is used to tune the length of each conductor so as to be electrically equal to about $n\lambda/4$.

In another more particular embodiment, the length of each conductor is established so as to optimize the signal-to-noise ratio (SNR) over a desired range in an area or region of interest, and the strip array antenna also is configured and arranged so as to substantially reduce coupling of signals between adjacent conductors. In this way, the conductor length can be set so the SNR is optimized for the region of interest through the use of the reactive component(s), whose values are set such as to tune the length of the conductor so as to be electrically equal to about $n\lambda/4$ with a geometry configured to substantially reduce signal coupling.

In a specific embodiment, the detection device includes a plurality or more, or more particularly a multiplicity, of reactive components, where a plurality of reactive components is electrically coupled to each conductor. In more particular embodiments, 2 or more, 3 or more, 4 or more, or 5 or more reactive components are electrically coupled to each conductor of the strip array antenna. In an alternative embodiment, each reactive component is configured so as to be adjustable to any one of a number of values within a range of values.

In exemplary embodiments, the reactive components or tuning elements are capacitors such as high-Q ceramic chip capacitors or variable capacitors such as those used by one skilled in the RF arts. In an alternative exemplary embodiment, the detection device is made using printed circuit board techniques. The printed circuit board is rigid and flat or is curved to conform to the shape of the sample or portion of the body of interest, for example, to confirm to the torso. In another embodiment, the printed circuit board is flexible, permitting the array to be wrapped around a region of interest. In embodiments utilizing a printed circuit board, the capacitors and/or inductive elements are discrete or are formed by printing or etching conductor on one or both sides of a piece of the printed circuit board. The conductor on single-sided circuit board can be utilized as a ground plane that is separated from circuit board bearing the conducting strips by a spacing "h", occupied by a dielectric material, or a flexible insulating material in the case of the flexible array, or spacers made from insulating material. Alternatively, the opposite side of a double-sided circuit board can be deployed as the (virtual) ground plane for the array with h being the thickness of the substrate.

In addition, the detection device further includes a ground plane or virtual ground plane spaced from each conductor. The ground plane or virtual ground also is electrically coupled to each of the plurality of reactive components, which are also electrically coupled to the conducting strips. In an alternative embodiment, the ground plane or virtual ground plane includes a plurality of ground or virtual ground plane members or sections, one section for each of the plurality of conductors. In more specific embodiments, an insulating member is disposed so as to fix the spacing between each conductor and the ground plane or between each conductor and at least the ground plane section for that conductor. As described herein the insulating member can be flexible, spacers made from an insulating material, a direlectric material or the substrate used in printed circuit board.

In another specific embodiment, the detection device includes a plurality or more, more particularly a multiplicity, of conductors, or in particular, about four or more conductors. In another specific embodiment, the detection device includes sixteen (16) or more conductors, more particularly thirty-two (32) or more conductors. In a further specific embodiment, the detection device includes a multiplicity of conductors in the range of from about 4 to about 32 conductors, more particularly in the range of from about 4 to about 16 conductors and further in the range of from about 16 to about 32 conductors.

The detection device further includes an encapsulation member comprising a substrate, on one surface of which is disposed the plurality of conductors and the other opposing surface thereof is disposed the ground plane. The encapsulation member can further include an overlay that covers the conductors disposed on the substrate. The substrate and the overlay are made of an insulating material.

Such insulating materials include but are not limited to air, glass, plexiglass, fiberglass, a dielectric, substrates such as those used for printed circuit boards, polymers, flexible polymers or polymer foams used with flexible arrays. Also useable are other types of formers commonly used for MRI head coils. In further specific embodiments, the insulating material is a dielectric having a dielectric constant so the wavelength of the EM wave on the each conductor is reduced so as to be in a desired range for the particular length of the conductor chosen when used in conjunction with the reactive components and also used to reduce any EM field losses arising from interactions between the detector array and the object of interest. In an exemplary embodiment, the encapsulation material has a dielectric constant in the range of from about 1 to 10. As discussed herein, however, it should be recognized that the present invention is not limited to detection devices that include such dielectric materials.

The ground plane or each of the ground plane sections is an electrical conductive material including, but not limited to, copper, aluminum or silver or a material that is plated with such exemplary conducting material. The ground plane/ground plane sections, as is known to those skilled in the art, is applied or otherwise secured to the other opposing surface that supports the conductors, separated by an insulating member.

The conductors also are made from any of a number of electrically conductive materials as is known to those skilled in the RF arts, including but not limited to, copper, aluminum and silver or gold or materials that include such conductive metals. The term conductor herein describes and includes any of a number of conductor shapes or arrangements as is known to those skilled in the art and thus are not particularly limited by the phrase strip array. Conductors or strips shall be understood to include conventional flat strips, wires, small diameter pipes (e.g., copper pipe), or conducting tape. Conductors or strips also shall be understood to include conductors or conductive material etched onto a printed circuit board or otherwise deposited onto the substrate.

In alternative embodiments, the electrical conductor for the ground plane/ground plane sections is a super-conducting material, or more specifically, comprised of those copper alloys known to those skilled in the art as being high-temperature superconductors. Also, the conductors or conducting strips are formed from a super-conducting material, or more specifically from those copper oxide alloys know to those skilled in the art as being high-temperature superconductors. In the case where the ground plane and/or conducting strips are comprised of super-conducting material and where such material must be maintained at below room temperature in order to maintain the super-conducting properties, then the strip array is cryostatically encapsulated to maintain such temperature conditions, using non-magnetic encapsulating elements.

In an illustrative embodiment in which super-conducting array elements are employed, the encapsulation material is super-insulation and the ground plane forms and/or is attached to the cooling element of an MR compatible cryo-pump/refrigerator. In another illustrative embodiment, the encapsulation material is a super-insulated dewar with cyro-fluid, such as liquid nitrogen in the case of high-temperature superconductors, or liquid helium in the case of conventional superconductors.

In other specific embodiments, the detection device is configured to operate such that the EM wave on each of the conductors is one of a standing wave or a traveling wave. In the case of a standing wave, the detection device further includes a mechanism that terminates one end of each conductor as one of an open circuit or a short circuit. In an alternative embodiment, each conductor includes a first and a second end and the first end of each odd numbered conductor of the strip array antenna is terminated as one of an open circuit or short circuit and the second end of each even numbered conductor thereof is terminated as the other of an open or a short circuit. In yet another alternative embodiment, the first end of each odd numbered conductor and the second end of each even numbered conductor are terminated as one of an open circuit or a short circuit. In the alternative embodiments, signals are outputted from the second end of the odd numbered conductor(s) and from the first end of the even numbered conductor(s).

In the "traveling wave" embodiment of the present invention, n is an even number such that the length of each conductor is a multiple of $\lambda/2$ and a termination of each conductor is terminated with a termination impedance electrically coupled or connected to one of a ground or virtual ground. In a particular embodiment, the termination impedance is a resistive termination with a value matched to the characteristic impedance, Zo, of the cable used to connect the strip to the MRI receiver electronics, when the detector coil is in contact with or "loaded" with the sample being studied. In a more particular embodiment, the termination impedance is comprised of an inductive and a capacitive reactance in parallel, where the reactances are tuned to resonate at the MR frequency with an impedance adjusted to a value of Zo at resonance. In another more particular embodiment, the termination impedance is capacitive, and is adjusted so that the impedance of the conducting strip at resonance is matched to the impedance of the connecting cable.

In other embodiments, the strip array antenna is one of a planar strip array antenna, an arcuate or curved strip array antenna, a flexible strip array antenna, or a cylindrical strip array antenna. In a specific embodiment, the plurality of conductors of the cylindrical or curved strip array antennas are configured so a long axis of each conductor extends axially or substantially parallel to the cylindrical axis. In another specific embodiment, the plurality of conductors of the cylindrical or curved strip array antennas are configured so each conductor extends substantially circumferentially or perpendicular to the cylindrical axis. In the case of the cylindrical strip array, each such circumferentially extending conductor can be further arranged so as to form a loop.

In yet another embodiment, the detection device is configurable so as to include a conducting electromagnetic (EM) interference guard that is electrical connected in a fashion so that the guard substantially electrically isolates at least a portion of each conductor (e.g., the ends of the conductors) from the environment including areas of the imaged object outside of the specific area being scanned and other conducting surfaces that may be present. In one embodiment, the EM guard includes two conducting guard strips, each guard strip being disposed proximal the ends of each conductor and insulated from the tuned conductors that form the detector elements, so as to minimize EM from the environment. In a more specific embodiment, a long axis for each of the guard strips extends generally perpendicular to a long axis of each conductor.

In another embodiment, a plurality of guard strips are arranged about the periphery of the plurality of conductors that form the detector elements so as to, in effect enclose both the ends and sides of the plurality of conductors. In yet another embodiment, the EM guard comprises one or more members that are configured so as to provide any of a number of geometrical shapes such as circular and oval. These one or more members are formed about the ends or about the periphery of the plurality of conductors such that the configuration minimizes external EM coupling or interactions.

In one embodiment, the EM guard or each guard strip thereof is electrical connected to ground. In another embodiment the continuity of the EM guard is interrupted by one or more semi-conductor switches, this allows the EM guard to be deactivated during MR excitation. In a more specific embodiment the semi-conductor switches are comprised of diodes that are reverse biased during excitation to stop the flow of currents (e.g., eddy currents) in the EM guard.

According to another aspect of the invention, the detection device is configured and arranged so as to provide both narrow band de-coupling and broadband de-coupling of the conductors. As indicated in U.S. Ser. No. 09/822,771, the teachings of which are incorporated herein by reference, broad-band de-coupling is best realized when the spacing "s" between the conductors and the height "h" of the encapsulation member is set so a ratio s/h is greater than or equal to about 3 or about 2.5. In further embodiments and to optimize SNR performance, the length "L" of the conductors in planar and curved arrays shall generally be chosen to be comparable to the size of the field-of-view (FOV), and further with a spacing "s" that is in the range of $L/5 \leq$ "s" $\leq 2L$, more particularly in the range of $L/2 \leq$ "s" $\leq 3L/2$. In embodiments of cylindrical arrays, L is the strip length for detectors with conducting strips running parallel to the cylindrical axis, or is the perimeter of the cylindrical detection coil whose diameter is chosen to fit the object of interest (head, limb, etc), where the conducting strips run perpendicular to the cylindrical axis, or a portion of the arc thereof, when the conducting strips do not form continuous loops.

According to another aspect of the present invention, the detection device includes a plurality of conducting strip members separated with spacing "s", and a multiplicity of reactive components comprising a plurality of reactive tuning components and a plurality of reactive coupling components. At least one of the plurality of reactive tuning components is electrically coupled between each conductor and the one of the ground or virtual ground and at least one of the plurality of reactive coupling components is electrically coupled between adjacent conducting strip members. In alternative embodiments, a plurality of reactive tuning components are electrically coupled between each conductor and the one of ground or virtual ground and a plurality of reactive coupling components are coupled between adjacent conducting strip members.

The values of the reactive tuning components electrically disposed between the conducting strips and the ground/virtual ground are established primarily to tune the effective electrical length of the conductor to a desired value of $n\lambda/4$. The values of the reactive coupling components connected between adjacent conducting strips are established primarily to minimize the coupling between adjacent strips for the particular spacing "s". In a particular embodiment, the reactive coupling components connected between adjacent strips are capacitors. In another embodiment, the reactive coupling components connected between adjacent strips comprise an inductor/capacitor (LC) pair tuned to resonate at the MR frequency with impedance adjusted to minimize coupling at the resonant frequency.

According to a further aspect of the present invention, the detection device includes a plurality of inductor elements at least one inductor element for each conductor and wherein each conductor includes a plurality of conductor members. Each conductor is configured and arranged so the at least one inductor element electrically couples each pair of said plurality of conductor members. In this case, the inductance of the inductor element is set so as to tune the effective electrical length of the conductor to a desired value. In one embodiment, the inductance of the inductor element is set so as to tune the effective electrical length of the conductor to a desired value of $n\lambda/4$. In another embodiment, the at least one reactive component and the at least one inductor element are used to tune the effective electrical length to the desired value.

In yet another embodiment, a plurality of reactive components are electrically coupled to the conductor, for example, one reactive component being coupled to each conductor member. In this embodiment, the plurality of reactive components and the at least one inductor element are used to tune the effective electrical length of each conductor to the desired value.

In a more particular embodiment, the conductor includes a multiplicity of conductor members that form a plurality or more of pairs of conductor members, where each pair of conductor members are electrically coupled to each other by an inductor element. In this embodiment, the at least one of the plurality of reactive components and the plurality of inductor elements electrically coupling the plurality or more conductor members making up each conductor are used to tune the effective electrical length of each conductor to the desired value. In yet another more particular embodiment, a plurality of reactive components are electrically coupled to the conductor, for example, one reactive component being coupled to each conductor member. In this embodiment, the plurality of reactive components and the plurality of inductor elements are used to tune the effective electrical length of each conductor to the desired value.

Also featured are a detection apparatus including a detection device as described above, and a plurality of receivers, one receiver for each conductor. In a more specific embodiment when using the detection apparatus in an MRI system, the detection apparatus further includes a plurality of transmit/receive (T/R) switching mechanisms (e.g., switches) one for each conductor/receiver path. The T/R switching mechanisms are configured and arranged so as to (a) de-couple each detection device conductor from its corresponding receiver during the period of time when an excitation EM signal is being applied to excite an NMR signal within an object of interest; (b) to de-activate each conductor during excitation by altering the impedance of each conductor so as to inhibit current flow that would otherwise generate fields that would counter the excitation field; and (c) following excitation, to permit coupling of each conductor with its corresponding receiver to conduct the detected MR signals to the MR system.

Additionally there is featured an excitation and detection system including the features described above for the detection system. Such an excitation and detection system further includes a transmitter that generates the excitation EM (RF) signals or pulses, an antenna for transmitting these signals into at least the region of the imaged object to be scanned, and a controller that selectively controls signal transmission and signal reception so that each occurs at predetermined times and/or predetermined time intervals.

Further, there is featured a MRI system including the excitation and detection system described above, a main or primary magnet system that generates a homogeneous magnetic field in a predetermined region in which the object or portion thereof is to be imaged, gradient coils for generating one or additional magnetic fields, controllers for controlling the operation and energization of each of the main and gradient coils, the generation/transmission of the excitation EM (RF) signals and the acquisition/detection of MR signals by the detection system. Such a system further includes a processing apparatus that processes the data acquired so as to yield an image of the object that was scanned.

Also featured are methods embodying the methodology implemented in the above-described systems and devices as well as methods for manufacturing a strip array antenna according to the present invention.

Other aspects and embodiments of the invention are discussed below.

BRIEF DESCRIPTION OF THE DRAWING

For a fuller understanding of the nature and desired objects of the present invention, reference is made to the following detailed description taken in conjunction with the accompanying drawing figures wherein like reference characters denote corresponding parts throughout the several views and wherein:

FIG. 1A is a top view of a RF strip array antenna according to one aspect of the present invention with the overlay removed for clarity;

FIG. 1B is a cross-sectional view of the RF strip array antenna of FIG. 1A with the overlay, taken along line 1B—1B;

FIG. 1C is a cross-sectional view of the RF strip array antenna of FIG. 1A with the overlay, taken along line 1C—1C;

FIG. 1D is a simplified schematic view illustrating interconnecting a reactive element between a conductive strip and the ground plane;

DESCRIPTION OF THE PREFERRED EMBODIMENT

Figure 2A:
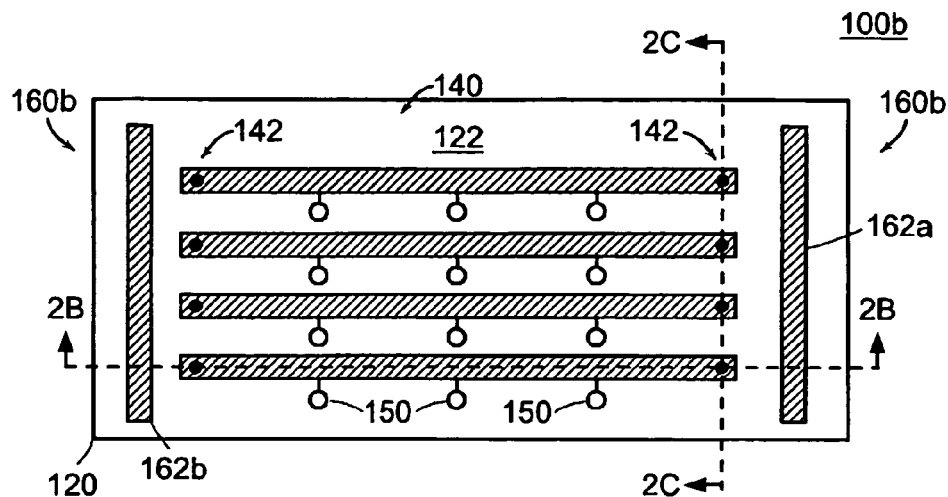
FIG. 2A is a top view of a RF strip array antenna according to a second aspect the present invention with the overlay material removed for clarity.

Referring now to the various figures of the drawing wherein like reference characters refer to like parts, there are shown in FIGS. 1–8 various views of near-field RF strip array antennas 100a–h according to the present invention. Such strip array antennas can be configured and arranged so as to form a strip array antenna that is planar, arcuate/curved or cylindrical in form. These illustrative forms of a strip array antennas 100a–h shall not be limiting, as the strip array antenna of the present invention can be configured or arrayed so as to form a strip array antenna having any geometric shapes or configuration. In the following, reference numerals 100, 130, 140 and 150 are used when generally referring respectively to a strip array antenna according to the present invention, to the overlay thereof, to any or all of the conductor strips thereof and to the reactive/tuning elements thereof. When reference is being made to a specific antenna embodiment, to a specific conductor strip, to a specific overlay configuration or to a specific reactive/tuning element to more particularly illustrate or describe a specific feature or effect, however, an alpha character shall be added to the reference numeral (e.g., 100a, 130b, 140c, etc.) to identify the specific antenna embodiment, overlay, conductor strip or reactive/tuning element.

Now referring to FIGS. 1A–D, there is shown various views of a RF strip array (SA) antenna 100a according to one aspect of the present invention that includes a ground plane 110, substrate 120, an overlay 130a, a plurality of conductor strips 140 and a plurality of reactive components primarily for tuning, hereinafter reactive tuning components 150. The SA antenna 100a also includes a plurality of BNC surface or panel mounts 170 as is known to those skilled in the art. In an exemplary embodiment, as illustrated in FIG. 1A, a BNC panel or surface mount 170 is provided proximal one end of each conductor strip 140 to provide a feeding point as more particularly described hereinafter. The BNC mounts or connectors 170, however, shall not be construed as a limitation, as other connectors or mounts known to those skilled in the art, such as SMA or SMB type, are contemplated for use with any SA antenna of the present invention. SMA or SMB type connectors may have particular use in cases where a SA antenna is configured with a multiplicity or more of conductor strips 140 such as that shown in FIGS. 4–5 or to reduce space.

Alternatively, feed points are attached directly to the cables that convey the detected MR signals to the scanner, for example, by soldered or welded joints connecting the center conductors of coaxial lines to points 170 and the cable shields to the ground plane 110 below. At the opposite end of the conductor strips from connectors 170 there is provided a termination 171, as discussed hereinafter and in connection with FIG. 10.

The ground plane 110, as is known to those skilled in the art, is made of an electrical conductive material including, but not limited to, copper, aluminum, silver or gold or materials being plated with such conducting material. The ground plane 110 is applied or otherwise secured or attached to a surface, the bottom surface 124, of the substrate 120. The ground plane 110 may be a unitary structure or it can comprise a plurality or more of sections 112, such as that shown and discussed in connection with FIG. 8 hereinafter. In a specific, exemplary embodiment, the ground plane 110 is electrically connected to ground. Because the ground plane 110 typically would be electrically coupled to the MR system ground only via RF input lines connected to the T/R switch 224 and the system preamplifier inputs 226 as discussed in connection with FIG. 10 hereinafter, its potential at RF frequencies may differ from that of true ground, and therefore more strictly speaking would be considered a virtual ground. Thus, it should be understood that, hereinafter, the phrase ground when used to describe the potential of the ground plane 110 includes a ground plane at either of true or virtual ground or other potentials that may arise on it even though the ground plane is nominally grounded via input connection lines or effectively isolated, for example, by use of baluns on the input connection lines. In a specific embodiment, and as discussed further elsewhere herein, the ground can be formed using well-known printed circuit board techniques.

As illustrated in FIG. 1, the plurality of conductor strips 140 are disposed on a top surface 122 of the substrate 120, where the top surface is opposite to and spaced from the ground plane 110. The conductor strips 140 are secured to the substrate top surface using any of a number of techniques known to those skilled in the art, for example, using low loss glue such as epoxy resin or by using any of a number of well known photolithographic techniques. It also is within the scope of the present invention for any of a number of techniques known in the art, such as those for making microchips or circuit boards, to be adapted for use in disposing the plurality of conductor strips 140 on the substrate top surface 122.

The substrate 120 is illustrated as a continuous sheet whose primary purpose is to provide a separation of conducting strips 140 from ground plane 110, and to provide electrical insulation there-between. It will be recognized that these functions also are achievable with a substrate comprised of (a) a first thinner section providing a surface upon which conductor strips 140 are attached as above; (b) a second thinner section upon which the ground plane 110 is attached; and (c) one or more thicker spacer sections that span the gap "g" therebetween, occupying a smaller surface area than array 120 or ground plane 110, with air gaps between. It should be recognized that such arrangements also fall within the scope of the present invention.

Figure 4:
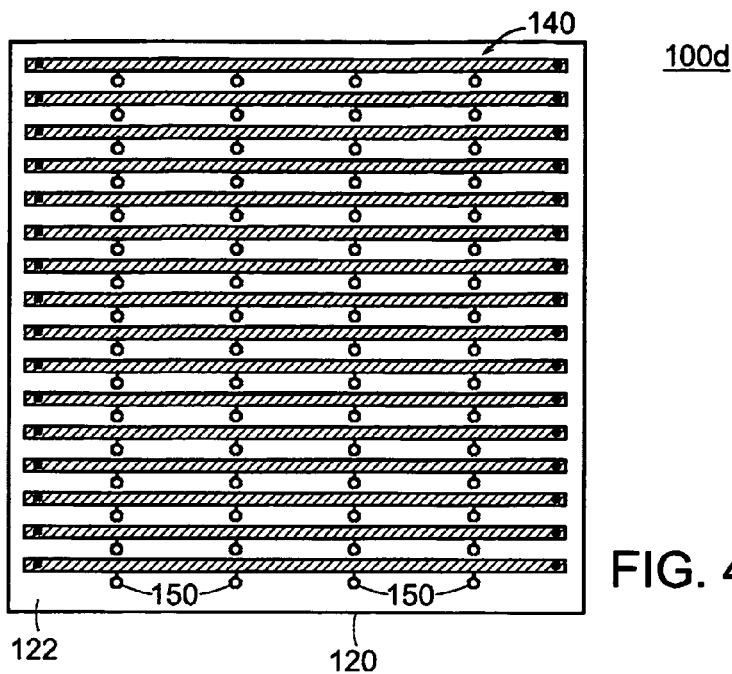
FIG. 4 is a top view of the RF strip array antenna of FIG. 1A but configured with 16 conductor strips and four reactive elements per strip.
Figure 5:
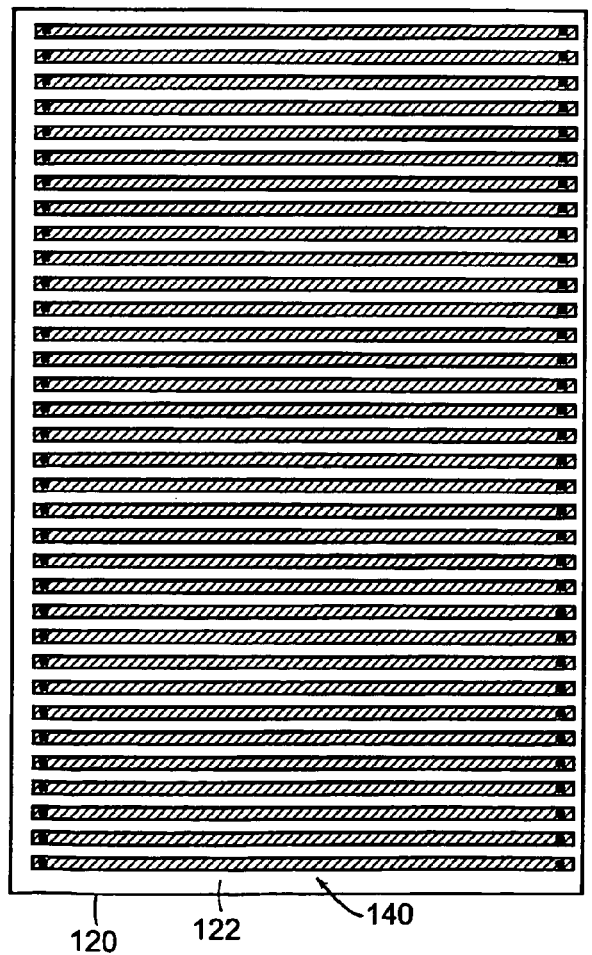
FIG. 5 is a top view of the RF strip array antenna of FIG. 1A but configured with 32 conductor strips but with reactive elements hidden for clarity.

In the illustrated embodiment, the SA antenna 100a includes four conductor strips 140, however, this shall not be construed as a limitation as to the number of conductor strips that can comprise a SA antenna 100 according to this or any other embodiment of the present invention. In other contemplated embodiments, a SA antenna 100 according to the present invention includes a plurality of conductor strips or a multiplicity of conductor strips that are disposed on the substrate top surface 122. In further contemplated embodiments, a SA antenna 140 according to the present invention includes sixteen (16) or more conductor strips or thirty-two (32) or more conductor strips, as is shown in FIGS. 4–5. In yet further contemplated embodiments, a SA antenna 100 according to the present invention is configured or arranged so as to include a multiplicity of conductor strips in the range of from about 4 to about 32 conductor strips, more particularly in the range of from about 4 to about 16 conductor strips and further in the range of from about 16 to about 32 conductor strips.

The conductor strips 140 are made from any of a number of electrically conductive materials as is known to those skilled in the RF arts, including but not limited to, copper, aluminum, silver, gold and/or materials plated with such conductive substances. The term conductor strip herein describes and includes any of a number of conductor shapes or arrangements as is known to those skilled in the art and thus are not particularly limited by the strip array. Conductors or conductor strips 140 shall be understood to include conventional flat strips, wires, small diameter pipes (e.g., copper pipe), or conducting tape. Conductors or strips also shall be understood to include conductors or conductive material etched onto a printed circuit board or otherwise deposited onto the substrate. Other characteristics or features of the conductor strips 140, such as length, width and thickness are exemplified hereinafter.

In alternative embodiments, the electrical conductor for the ground plane 110 and/or ground plane sections 112 (FIG. 8) is a super conducting material, or more specifically, comprised of those copper alloys known to those skilled in the art as being high-temperature superconductors. Also, the conductors or conducting strips 140 are formed from a super-conducting material, or more specifically from those copper oxide alloys know to those skilled in the art as being high-temperature superconductors. In the case where the ground plane 110 and/or conductor strips 140 are comprised of super-conducting material and where such material must be maintained at below room temperature in order to maintain the super-conducting properties, then the array of conductor strips 140 is cryostatically encapsulated to maintain such temperature conditions, using non-magnetic encapsulating elements.

In an illustrative embodiment in which super-conducting array elements are employed, the encapsulation material is super-insulation and the ground plane 110 forms and/or is attached to the cooling element of an MR compatible cryo-pump/refrigerator. In another illustrative embodiment, the encapsulation material is a super-insulated dewar with cyro-fluid, such as liquid nitrogen in the case of high-temperature superconductors, or liquid helium in the case of conventional superconductors.

In the embodiment illustrated in FIGS. 1A–C, a reactive component 150 is electrically interconnected to each of the plurality of conductor strips 140 and to the ground plane 110. Although the reactive component 150 is shown as being connected at about the mid-point of the conductor strip 140 this shall not be construed as being a limitation, as it is within the scope of the present invention for the reactive component to be connected anywhere along the length of the conductor strip.

Figure 2B:
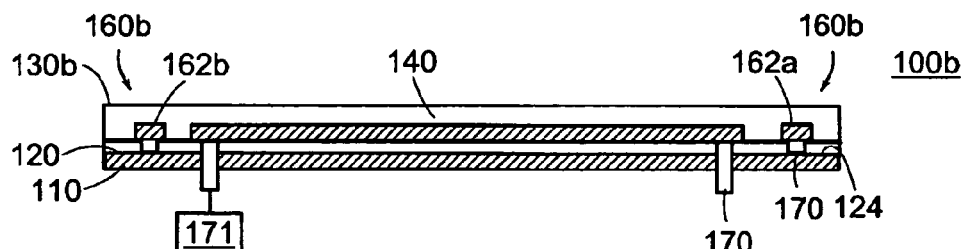
FIG. 2B is a cross-sectional view of the RF strip array antenna of FIG. 2A with the overlay, taken along line 2B—2B.
Figure 2C:
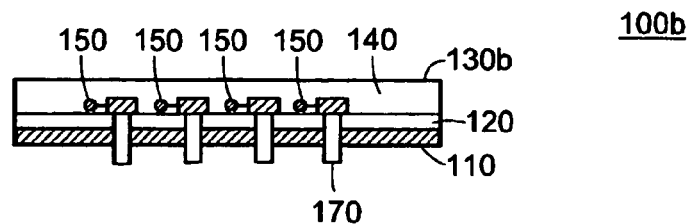
FIG. 2C is a cross-sectional view of the RF strip array antenna of FIG. 2A with the overlay, taken along line 2C—2C.

Although a single reactive tuning element or component 150 is shown as being connected to each conductor strip 140, this also shall not be construed as being a limitation. It is within the scope of the present invention for a plurality or more of reactive tuning components 150 to be electrically coupled to each conductor strip 140 and the ground plane 110. In more specific embodiments, 2 reactive tuning components 150 (FIGS. 3A–C), 3 reactive tuning components (FIGS. 2A–C), 4 reactive tuning components (FIG. 4) or 5 reactive tuning components (FIGS. 10A–C) are electrically coupled to each conductor strip 140 and the ground plane. More particularly, the plurality of reactive tuning components 150 are arranged so each is connected at a different point along the length of the conductor strip 140. In more specific embodiments and as shown in FIGS. 2–4, the reactive components 150 are coupled at different points of the conductor strip 150 so as to be in effect distributed along the length of the conductor strip.

In exemplary embodiments, and with specific reference to FIG. 1D, each reactive tuning component 150 includes a capacitor 152 and interconnecting wiring 154. The capacitor 152 is any of a number of capacitors as is known to those skilled in the RF arts, and include capacitors such as high-Q ceramic chip capacitors or variable capacitors. Alternatively, the reactive tuning component 150 includes an inductor or inductor element as is known to those skilled in the art and the interconnecting wiring 154 between the conductor strip 140 and the ground plane. In an alternative exemplary embodiment, and in the case where the SA antenna 100 is made using printed circuit board techniques, the capacitor 152 and/or the inductor element 158 and its interconnecting wiring 154 are formed by printing or etching conductor on both side of a thin piece of printed circuit. The interconnecting wiring 154 is any of a number of wires, strips, conductive pipes, conductive tape or functional equivalents known to those skilled in the RF art that are appropriate for the intended use.

Figure 8:
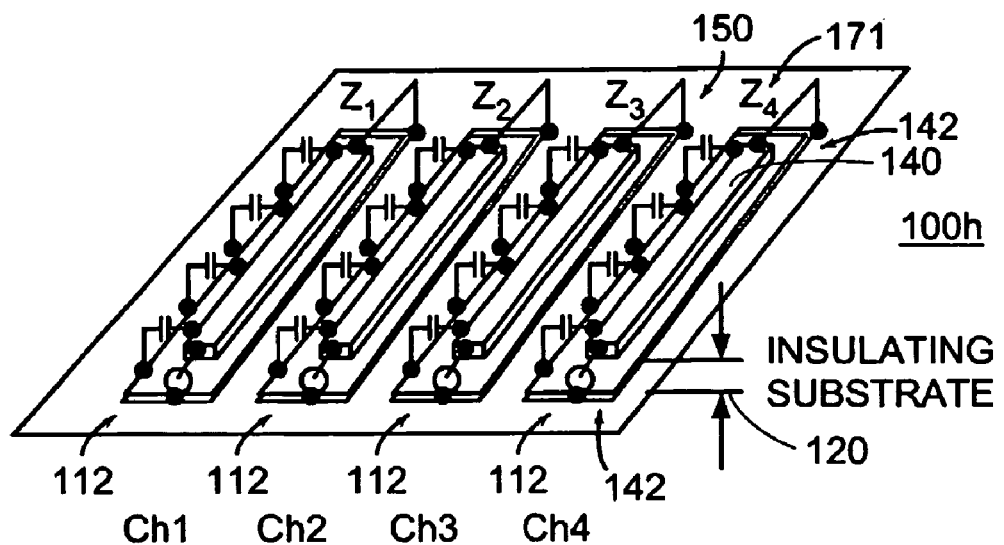
FIG. 8 is a perspective view of a RF strip array antenna according to a sixth aspect of the present invention.
Figure 9A:
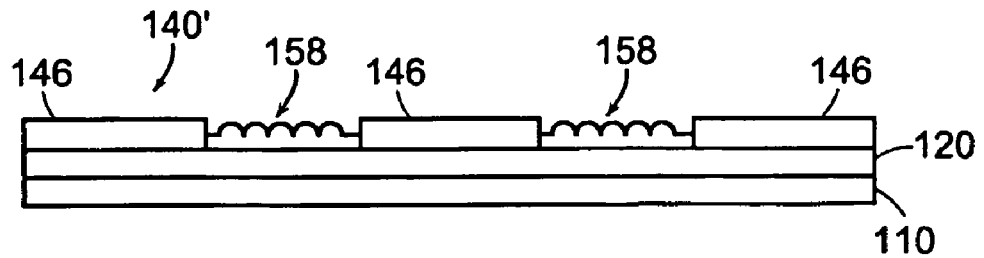
FIG. 9A is a schematic side view of single conductor strip having a plurality of segments illustrating one technique for adjusting the apparent electrical length of a conductor strip without the presence of one or more reactive tuning elements.

In alternative embodiments, and with reference also to FIG. 9A, any of the SA antenna embodiments described herein (FIGS. 1–8) are configurable so as to include one or more (e.g., a plurality) inductor elements 158, at least one inductor element for each conductor strip 140'. Also, each conductor strip 140' is configured and arranged so as to comprise a plurality of conductor strip members 146, where the at least one inductor member 158 is arranged so as to electrically couple each pair of the plurality of conductor strip members 146. In this embodiment, the SA antenna is configured so it does not include reactive tuning elements.

Figure 9B:
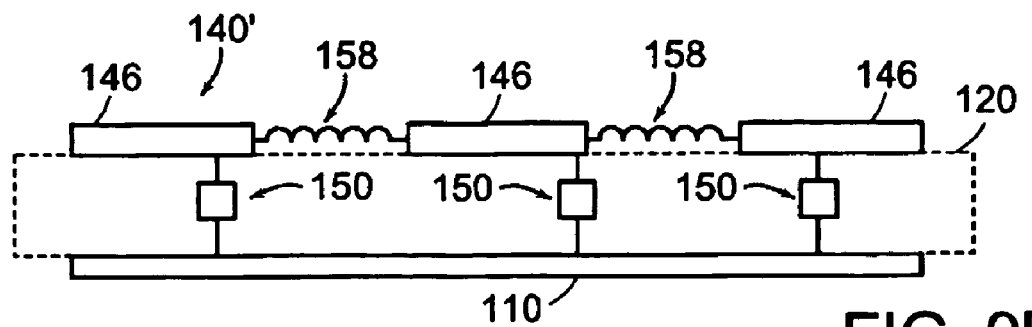
FIG. 9B is a schematic side view of single conductor strip having a plurality of segments illustrating a technique for adjusting the apparent electrical length of a conductor strip with the presence of one or more reactive tuning elements.

In another embodiment, and with reference also to FIG. 9B, any of the SA antenna embodiments described herein (FIGS. 1–8) are configurable so as to include one or more (e.g., a plurality) inductor elements 158, at least one inductor element for each conductor strip 140' and one or more reactive tuning components 150. Also, each conductor strip 140' is configured and arranged so as to comprise a plurality of conductor strip members 146, where the at least one inductor member 158 electrically couples each pair of the plurality of conductor strip members 148. The one or more reactive tuning components 150 also are electrically coupled to the conductor strip 140'. More particularly the one or more reactive tuning components 150 are electrically coupled to the plurality of conductor strip members 146 that make up each of the conductor strips 140'; more specifically, the one or more reactive tuning components 150 are coupled to each of the plurality of conductor strip members 146 comprising each of the conductor strips.

In yet another additional embodiment, and with reference also to FIG. 9C, any of the SA antenna embodiments described herein (FIGS. 1–8) are configurable so as to include one or more second type of reactive elements, hereinafter reactive coupling elements 151, with at least one reactive coupling element for each adjacent pair of conductor strips 140 of an array. The at least one reactive coupling element 151 is arranged to connect between adjacent conductor strips and be adjusted so as to electrically minimize the coupling between each pair of conductor strips 140. In one embodiment each reactive coupling element 151 is a capacitor. In another embodiment, each reactive coupling element comprises an inductor/capacitor (LC) pair tuned to resonate at the MR frequency of the SA antenna with impedance adjusted to minimize coupling.

Figure 9C:
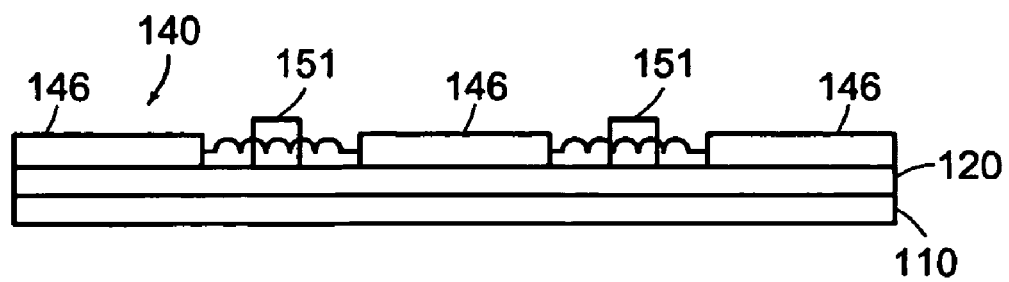
FIG. 9C is schematic end view of a portion of a strip array antenna illustrating a technique for adjusting coupling between adjacent conducting strips using a plurality of reactive coupling components without the presence of one or more reactive tuning elements.
Figure 9D:
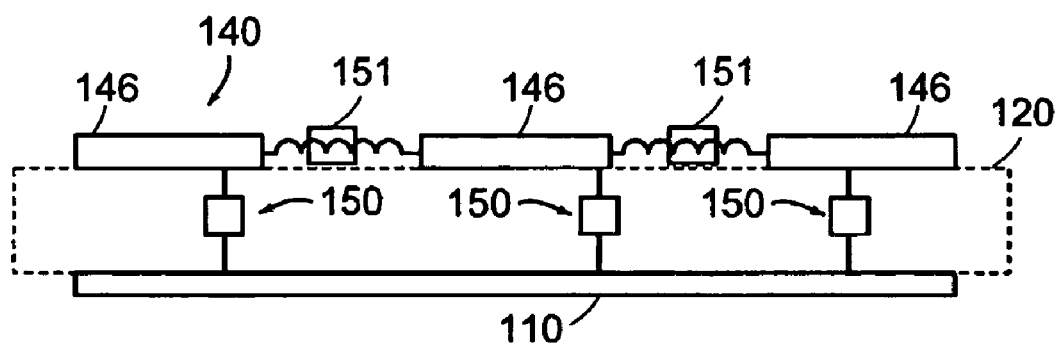
FIG. 9D is schematic end view of a portion of a strip array antenna illustrating a technique for adjusting coupling between adjacent conducting strips using a plurality of reactive coupling components with the presence of one or more reactive tuning elements.

In a further additional embodiment, and with reference also to FIG. 9D, any of the SA antenna embodiments described herein (FIGS. 1–8) are configurable so as to include one or more (e.g., a plurality) reactive coupling elements 151, with at least one reactive coupling element for each pair of adjacent conductor strips 140, and one or more reactive tuning components 150. The at least one reactive coupling member 151 is electrically coupled between each pair of conductor strips 140. The one or more reactive tuning components 150 are electrically coupled between each conductor strip 140 and the ground plane 110.

Figure 9E:
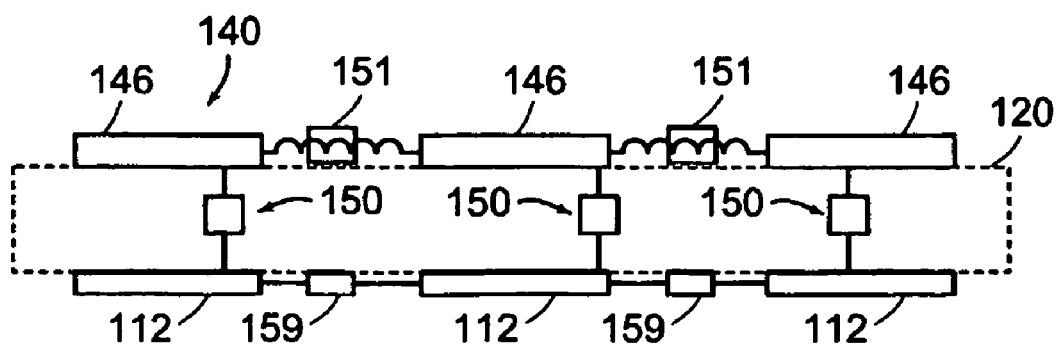
FIG. 9E is schematic end view of a portion of a strip array antenna having a plurality of ground plane sections illustrating a technique for adjusting coupling between adjacent conducting strips and the virtual ground plane sections using reactive coupling components connected between adjacent conducting strips and between ground plane sections, with the presence of a plurality of reactive tuning elements.

In yet a further additional embodiment, and with reference also to FIG. 9E, for SA antenna embodiments in which the ground plane comprises a plurality of ground plane sections 112, such as that shown in FIG. 8, the SA antenna embodiment is configurable so as to include one or more (e.g., a plurality) reactive coupling components 151, with at least one reactive coupling component for each pair of adjacent conductor strip members 146, one or more (e.g., a plurality) reactive coupling elements 159, at least one reactive coupling element for each pair of adjacent ground plane sections 112, and one or more reactive tuning components 150. In this embodiment, each pair of conductor strip members 146 are electrically coupled by the at least one reactive coupling component 151.

Other characteristics or features of the reactive tuning component(s) 150, the reactive coupling elements 159, such as sizing or the capacitance, are discussed hereinafter. Also, other characteristics or features of the reactive coupling components 151, more particularly the inductor element(s) 158 thereof, such as sizing are discussed hereinafter.

In the embodiment illustrated in FIGS. 1B–C, the overlay 130a is applied so as to cover each of the conductor strips 140 and at least a portion of the substrate top surface 122 so the plurality of conductor strips are in effect encapsulated by a member comprising the substrate 120 and the overlay. More particularly, the illustrated embodiment of the overlay 130a includes a cover member 132a that rests upon the plurality of conductor strips 140 and extends over the substrate top surface 122. In an exemplary embodiment, the cover member 132a is a planar member, more specifically having the shape and planar dimensions of the substrate 120. The cover member 132a is secured to the substrate top surface 122 using any of number of techniques known in the art. In an exemplary embodiment, the substrate top surface 122 and the opposing surfaces of the cover member 132a are preferably secured in areas 134a about the periphery of the substrate 120 and/or cover member for example using glue or epoxy resin with low electrical loss.

In alternative embodiments, as illustrated in FIGS. 2–3, the overlay 130b comprises a material that is applied or deposited upon the conductor strips 140 and the substrate top surface 122 such that the substrate 120 and the overlay 130b form in effect an integral structure. Such material deposition or application shall be accomplished using any of a number of techniques known to those skilled in the art, such as for example a thin film deposition technique, polymer coating, or heat-shrink wrap.

In more particular embodiments, the substrate 120 and the overlay 130 comprise any one of a number of insulating materials known to those skilled in the art. Such insulating materials include but are not limited to air, glass, Plexiglas, fiberglass, a dielectric or substrates such as those used for printed circuit boards. Also useable are other types of formers commonly used for MRI head coils.

In further specific embodiments employing a dielectric substrate, materials with specific dielectric constants in the range 1–10 can be selected. The use of a dielectric substrate in this manner alters the value of the reactances for the reactive tuning components 150 that are required to tune the SA for a given desirable conducting strip length L and MR frequency. For example, in a typical MRI application in a 1.5 Tesla magnetic field, the quarter wavelength in air of the 63.87 MHz proton NMR signal is about 117 cm, compared to about 46 cm when the material comprising the substrate 120 and the overlay 130 is glass with $_\epsilon$=6.4. Thus, the use of glass alters the value of the reactances of the reactive tuning components 150, needed to tune strips 140, when the desirable strip lengths L are shorter than 46 cm. Such materials are exemplary, as any material known in the art can be used that yields a SA antenna that is otherwise consistent with the use and purpose of a SA antenna 100 according to the present invention as hereinafter discussed.

Referring now to FIGS. 2A–C, there is shown various views of a near-field RF strip array (SA) antenna 100b according to a second aspect of the present invention. Such a SA antenna 100b includes a ground plane 110, a substrate 120, an overlay 130b, a plurality of conductor strips 140, a plurality or more (i.e., three per conductor strip) of reactive components 150, a plurality of BNC surface or panel mounts 170, a plurality of terminations 171, one for each conductor strip and an EM guard 160b. Reference shall be made to the foregoing discussion regarding FIGS. 1A–D for the ground plane 110, the substrate 120, the overlay 130b, the conductor strips 140, the reactive tuning components 150 and the plurality of BNC surface or panel mounts 170 and the terminations 171, which applies equally to the corresponding structural elements or features for the SA antenna according to this aspect of the invention.

The EM guard 160b of this embodiment includes end guard members 162a,b that are arranged on the substrate top surface 122 so as to be proximal the ends 142 of the plurality of conductor strips 140. The end guard members 162a,b are conductive members that are configured and arranged so that EM interactions between the plurality of conductor strips 140 and the environment, including with areas of the object beyond the ends 142 of each conductor strip 140 of the SA antenna 100b and not presently of interest, are minimized. Additionally, the EM guard members 162a,b are arranged so a long axis of each such member extends in a direction that is substantially perpendicular to a long axis of the conductor strip.

The conductive material comprising the end guard members 162a,b includes, but is not limited to copper, aluminum or silver or material plated with such conductive materials. In specific embodiments, the end guard members 162a,b are electrically connected to ground or virtual ground or are not directly connected to the other conducting components. In an exemplary embodiment, each of the end guard members 162a,b is a copper member having a width of about 3–12 mm, a thickness of about<1 mm and a length comparable to the distance spanned by the plurality of conductor strips 140, although it shall be understood that the end guard members 162a,b as well as the other members making up the EMF guard 160 are not particularly limited to this exemplary embodiment. As indicated above, the conductive material comprising the end guard members can be applied using any of a number circuit board manufacturing techniques.

Figure 3A:
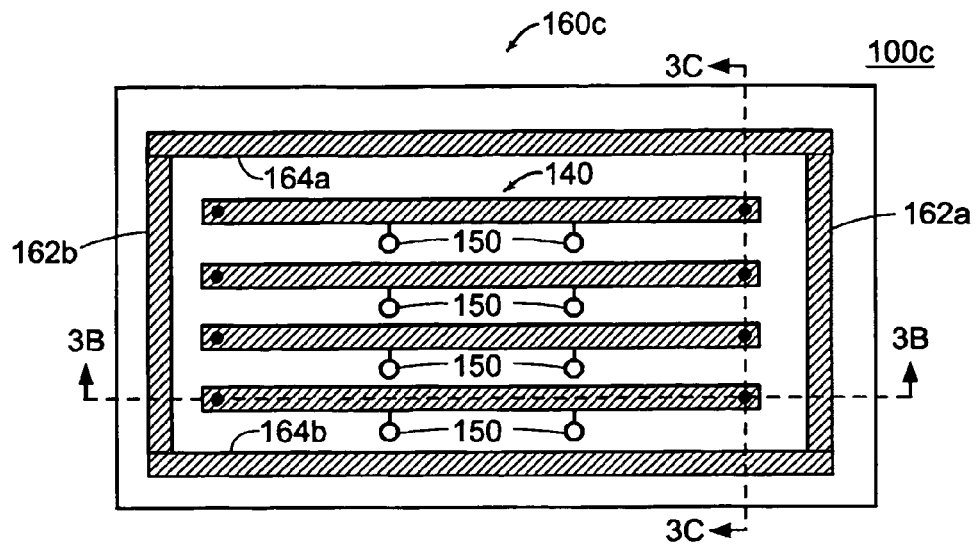
FIG. 3A is a top view of a RF strip array antenna according to a third aspect of the present invention with the overlay material removed for clarity.
Figure 3B:
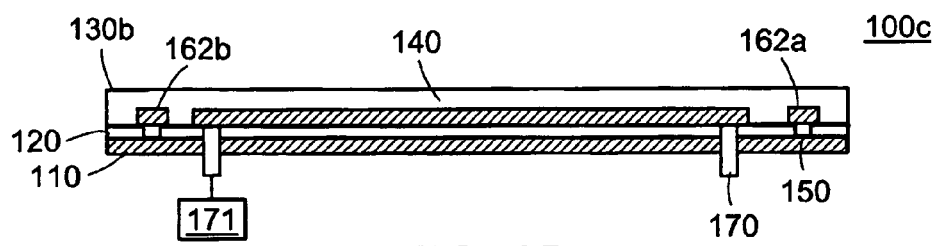
FIG. 3B is a cross-sectional view of the RF strip array antenna of FIG. 3A with the overlay, taken along line 3B—3B.
Figure 3D:
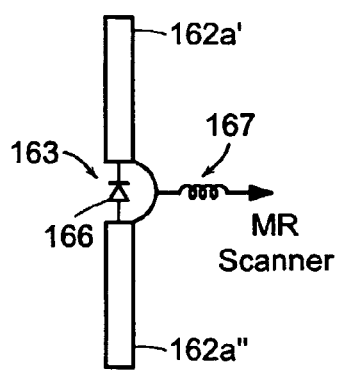
FIG. 3D is a side view of a portion of an EM guard or conducting strip including a mechanism that selectively couples and decouples the guard strip.
Figure 3C:
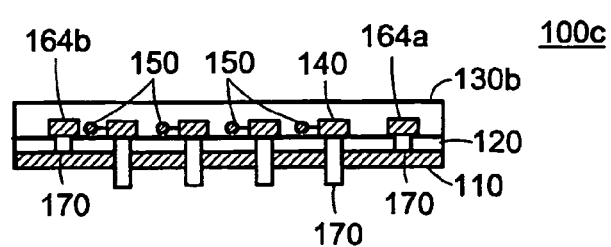
FIG. 3C is a cross-sectional view of the field RF strip array antenna of FIG. 3A with the overlay, taken along line 3C—3C.

There is shown in FIGS. 3A–C, an SA antenna 100c according to a third aspect of the present invention. Such an SA antenna 100c includes a ground plane 110, a substrate 120, an overlay 130b, a plurality of conductor strips 140, a plurality of reactive components 150 (i.e., two per conductor strip), a plurality of BNC surface or panel mounts 170, a plurality of terminations 171, one for each conductor strip 140, and an EM guard 160c. Reference shall be made to the foregoing discussion regarding FIGS. 1A–D for the ground plane 110, the substrate 120, the overlay 130b, the plurality of conductor strips 140, the plurality of reactive components 150, the plurality of BNC surface or panel mounts 170 and the terminations 171, which applies equally to the corresponding structural elements or features for the SA antenna according to this aspect of the invention. Reference also should be made to the foregoing discussion regarding FIGS. 2A–C for common details/information regarding the EMF guard 160c of this embodiment not otherwise provided below (e.g., for material composition and sizing).

The EM guard 160c of this embodiment includes end guard members 162a,b and side guard members 164a,b that are arranged on the substrate top surface 122 so as to lie about the periphery of the array of conductor strips 140, where each end and side guard member 162a,b; 164a,b are electrically coupled so as to form a continuous loop. The end and side guard members 162a,b; 164a,b are configured and arranged to minimize EMF interactions with the environment, particularly areas of the object not presently of interest and lying outside the perimeter of the EM guard 160c.

In a particular embodiment, and with reference also to FIG. 3D, the EM guard 160c is further configured and arranged to minimize interference with the MR excitation field due to the generation of eddy currents in the EM guard. In this embodiment, the EM guard 160c is broken in at least one place 163 and a semi-conducting switch such as a diode 166 (e.g., a PIN diode) or a transistor employed as the diode extends across the break. A switched DC input voltage 201 is provided by the MR system via line 167 during MR excitation to bias the semi-conductor off during excitation, thereby substantially eliminating eddy currents during this period. During MR reception, the diode 166 is biased to conduct and function as an EM guard as described above.

Although the EM guard 160c is illustrated as being composed of four guard members, this shall not be construed as a limitation as to the configuration and arrangement of the EM guard. It is within the scope of the present invention for the EM guard 160 to comprise one or more members that are configured so as to form any of a number of geometric shapes known to those skilled in the art (e.g., rectangular, circular, oval, etc.) that would be otherwise consistent with the shielding of the array of conductor strips 140 comprising a SA antenna 100 according to the present invention from external or remote EM field effects and the like. The EM guard 160c generally extends about the periphery of the array of conductor strips 140 when the members are disposed on the substrate top surface 122 and joined together, and will be separated and electrically insulated from the conductor strips 140. In one specific embodiment, the EM guard is electrically connected to ground or virtual ground. In another embodiment it is not directly connected to the other conducting components.

Figure 6A:
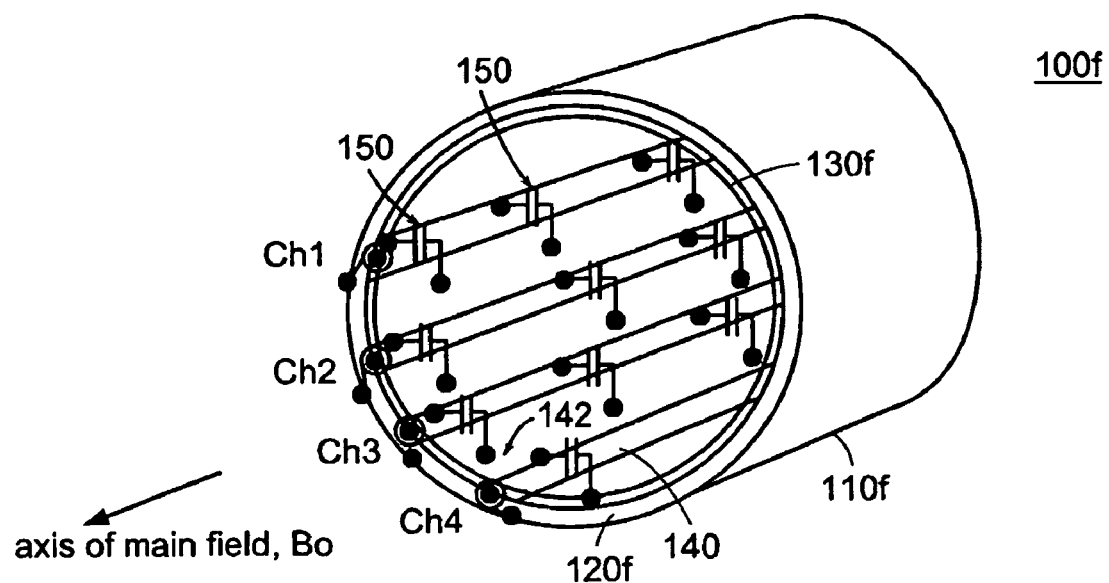
FIG. 6A is a perspective view of a RF strip array antenna according to a fourth aspect of the present invention.
Figure 6B:
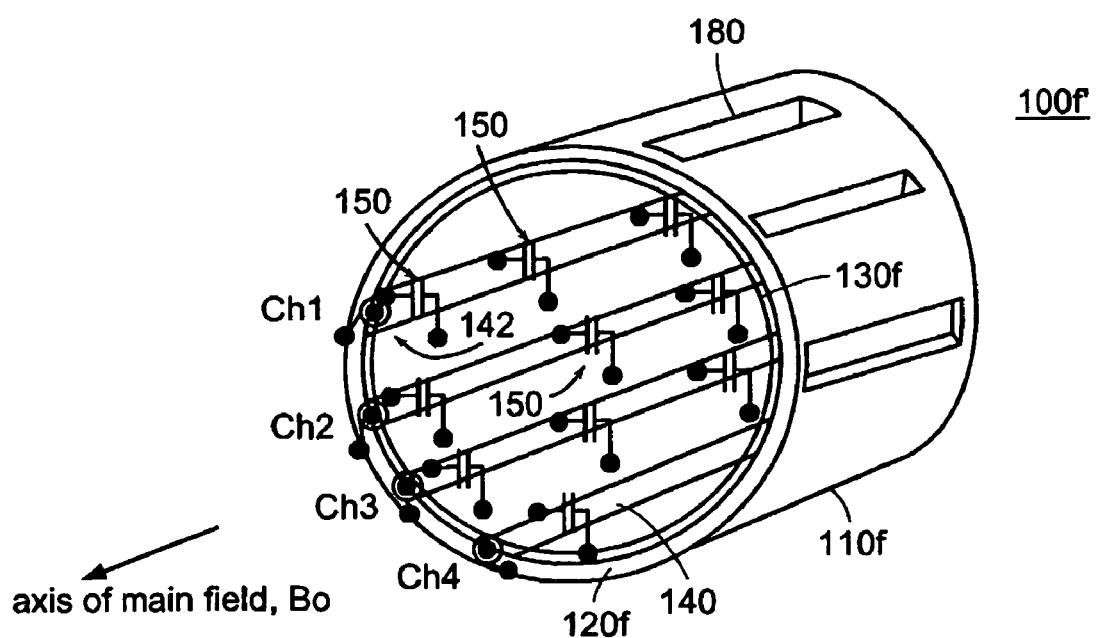
FIG. 6B is a perspective view of the RF strip array antenna of FIG. 6A but configure with slots through the ground plane and substrate.

Referring now to FIGS. 6A–B, there is shown various views of near-field RF strip array (SA) antennas 100f, 100f according to a fourth aspect of the present invention. More particularly there is shown a strip array antenna that is configured and arranged so as to be generally in the form or shape of a cylinder. Referring now to FIG. 6A, there is shown a cylindrical strip array (CSA) antenna 100f that includes a cylindrical ground plane 110f, a cylindrical substrate 120f, a cylindrical overlay 130f, a plurality of conductor strips 140, and a multiplicity of reactive tuning components 150. The plurality of conductor strips 140 and the multiplicity of reactive tuning components 150 are arranged so there is a plurality of reactive tuning components that are electrically coupled to each conductor strip (e.g., four per conductor strip) and to the ground plane 110f. Reference shall be made to the foregoing discussion regarding FIGS. 1A–D for further details of the ground plane 110f, the substrate 120f, the overlay 130f, the conductor strips 140, and the reactive tuning components 150 where not otherwise provided below.

According to this aspect of the present invention, the conductor strips 140 are arranged on the cylindrical insulating member or cylindrical substrate 120f so the long axis of each conductor strip extends axially or parallel to the cylindrical axis. In this configuration, the conductor long axis also is typically parallel to the axis of the main magnetic field (Bo). External connection to the conductor strips 140 can be accomplished at the ends 142 of the conductor strip at the ends of the cylinder. For example, and as shown in FIG. 6A, one of the ends 142 of each conductor strip can be connected to one of the various input channels (e.g., Ch1, Ch2, Ch3, Ch4). Alternatively, the strip array antenna can further include a plurality or more of BNC surface or panel mounts 170 that pass through the substrate 120 and which connect to the ends of the conductors such as that shown in FIGS. 1B, 2B, 3B. In addition, the other of the ends 142 of each conductor strip 140 is electrically coupled to a termination 171 as herein described.

In a more particular embodiment, the CSA antenna 100f further includes an EM guard comprised of circular EM guard ring members, more specifically two circular end guard members that are arranged on the inner surface of the substrate 120f so as to be proximal to both ends 142 of the plurality of conductor strips 140, at the open ends of the CSA antenna. As with the end guard members described above in connection with FIGS. 2A–C, the end guard members are conductive members that are configured and arranged so as to limit coupling of EM fields from the environment, including areas of the object not presently being scanned, to the plurality of conductor strips 140; especially from areas proximal or near the conductor strip ends 142. Reference shall be made to the foregoing discussion regarding FIGS. 2A–C and 3A–D for other details (e.g., material composition) not otherwise described above.

The EM guard is separated and electrically insulated from conductor strips 140 and the strip ends 142 and in one specific embodiment, the EM guard is electrically connected to ground or virtual ground. In another embodiment the EM guard it is not directly connected to the other conducting components. In yet another embodiment, and with reference also to FIG. 3D to limit deleterious effects of the guard rings being activated during MR excitation, each EM guard member is broken in at least one place and fitted with at least one semi-conducting switch such as a diode 166 (e.g., a PIN diode) or a transistor employed as a switch/diode. A switched DC input voltage (201) is provided by the MR system during MR excitation to bias the semi-conductor off during excitation. During MR reception, the switch is biased to conduct and function as an EM guard as herein described.

Referring now to FIG. 6B, there is shown an alternative embodiment of a CSA antenna 100f according to the third aspect that includes a cylindrical ground plane 110f, a cylindrical substrate 120f, a cylindrical overlay 130f, a plurality of conductor strips 140, and a multiplicity or more of reactive components 150. Reference shall be made to the foregoing discussion regarding FIGS. 1A–D and 6A for the ground plane 110, the substrate 120f, the overlay 130f, the conductor strips 140, and the reactive components 150 for details thereof not otherwise provided below. Reference also should be made to the foregoing discussion regarding FIG. 6A for external connection details for the conductor strips 140 and the provision of an EM guard in additional embodiments.

In this embodiment, the ground plane 110, the substrate 120f, the overlay 130f and the conductor strips 140 are configured and arranged so that a plurality or more of through apertures 180 are provided that extend from within the interior volume of the CSA antenna 100f' to the exterior of the CSA antenna. In the illustrated embodiment the through apertures 180 extend along the central axis of the cylinder comprising the CSA antenna 100f'. In this way, air flow, visual access, and access to the interior volume for possible monitoring and/or interventional devices is beneficially provided.

In an alternative embodiment of the CSA antenna illustrated in FIG. 6B, the ground plane 110 comprises a plurality or more of sections 112, such as that shown and discussed in connection with FIG. 8 hereinafter. As indicated hereinafter, this has the advantage of limiting possible eddy currents that may deleteriously be induced in the ground plane during MR excitation. In this case, the through apertures 180 can be formed so as to be disposed in the open area between each of the ground plane sections 112. In addition, a translucent insulating material can be used for the substrate 120 and overlay so as to increase the amount of light passing through to the interior volume.

In yet another alternative embodiment, omitting sections or portions of the ground plane 110 between the conductor strips 140 forms the through apertures 180. A transparent substrate, such as glass, Plexiglas or the like, is disposed therebetween so as to form a plurality of visualization apertures.

Figure 7A:
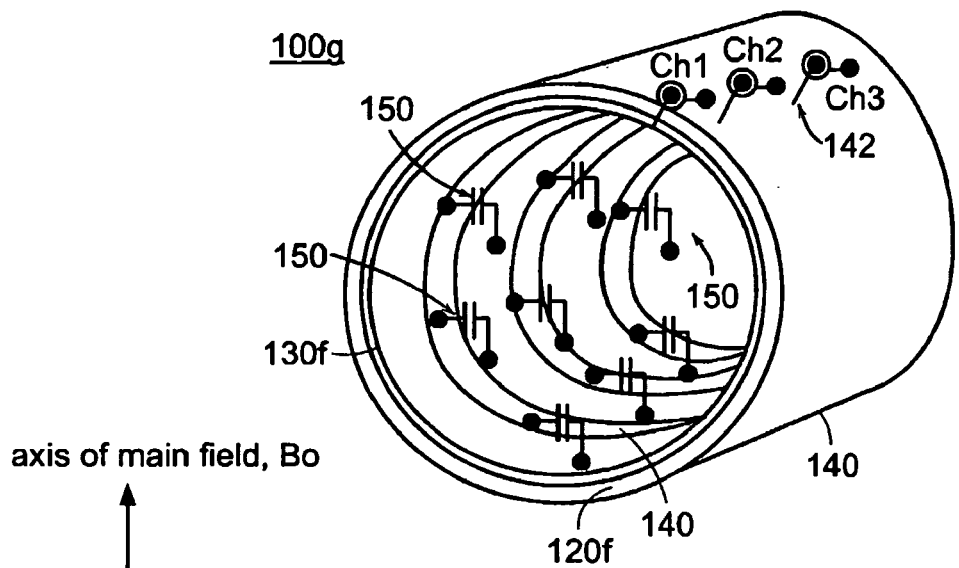
FIG. 7A is a perspective view of a RF strip array antenna according to a fifth aspect of the present invention.
Figure 7B:
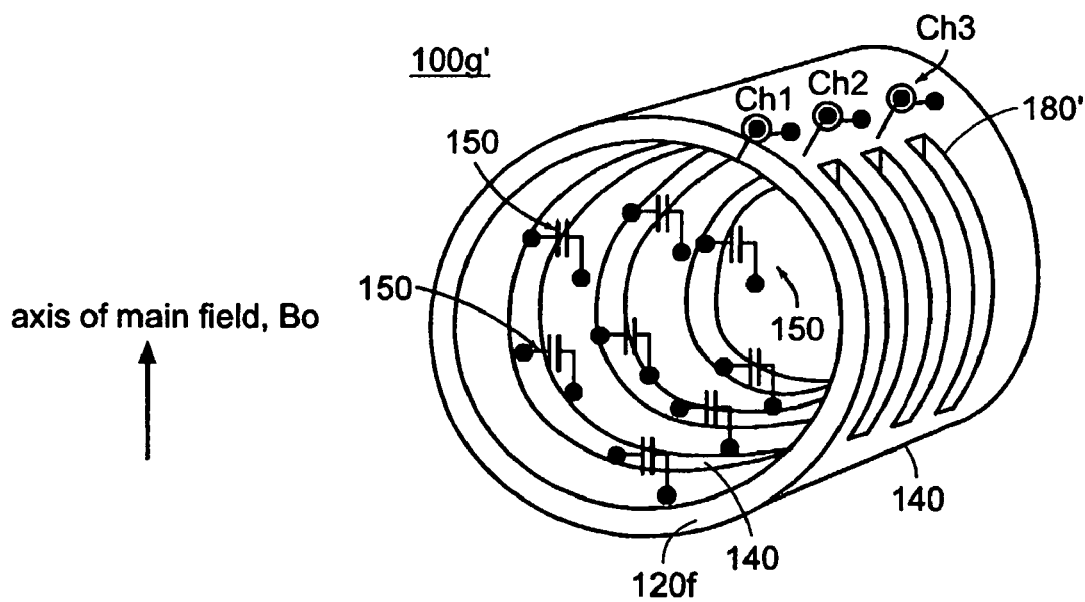
FIG. 7B is a perspective view of the RF strip array antenna of FIG. 7A but configured with slots through the ground plane and substrate.

Referring now to FIGS. 7A–B, there is shown various views of a RF strip array (SA) antenna 100g, 100g' according to a fifth aspect of the present invention. More particularly there is shown another SA antenna that is configured and arranged so as to be generally in the form or shape of a cylinder. Referring to FIG. 7A, there is shown another cylindrical strip array (CSA) antenna 100g that includes a cylindrical ground plane 110f, a cylindrical substrate 120f, a cylindrical overlay 130f, a plurality of conductor strips 140, and a multiplicity of reactive tuning components 150. The plurality of conductor strips 140 and the multiplicity of reactive tuning components 150 are arranged so there is a plurality of reactive tuning components that are electrically coupled to each conductor strip and the ground plane 110f. Reference shall be made to the foregoing discussion regarding FIGS. 1A–D for the ground plane 110, the substrate 120, the overlay 130, the conductor strips 140, and the reactive tuning components 150 for details thereof not otherwise provided below. Reference also should be made to the foregoing discussion regarding FIG. 6A for a further embodiment that includes an EM guard.

According to this aspect of the present invention, the conductor strips 140 are arranged on the cylindrical insulating member or cylindrical substrate 120f so the long axis of each conductor strip extends circumferentially. More particularly, each conductor strip 140 extends circumferentially about the inner diameter of the cylindrical substrate 120f. Thus, in this aspect of the invention, the plane intersecting the circumference of each conducting strip 140 is perpendicular to the cylindrical axis of the coil and the cylindrical axis is typically, generally substantially perpendicular or transverse to Bo.

In one embodiment, consistent with an array like that shown in FIGS. 1–6, each conductor strip 140 is configured and arranged so as to have two ends 142 and so that each conductor strip extends substantially around the inner cylindrical circumference of the substrate surface 122. In this case, the CSA antenna further includes a plurality of BNC surface or panel mounts 170, or functional equivalents with center connections. These plurality of BNC surface or panel mounts 170 pass through the substrate 120f and ground plane 110f, while being insulated from and not making electrical contact with the ground plane, to electrically couple to the ends 142 of the conductor strips 140 and also to connect the connector ground leads to the ground plane 110, much the same way as shown in FIGS. 1B, 2B, 3B. As discussed herein, a termination 171 is provided at one of the ends 142 of each conductor strip 140.

According to another embodiment, a transverse field CSA 100g is configured and arranged so that each conductor strip 140 is not broken so as to have separate ends 142, but instead is configured and arranged so that each conductor strip forms a continuous loop or circle around the inside surface of the cylindrical substrate 120f. In this embodiment connections to the CSA 110g are provided by a plurality of BNC surface or panel mounts 170 or functional equivalents, with center connections passing through the cylinder substrate 120f and ground plane 110f to connect to each of the continuous conductor strips 140, and with ground input leads connected to the (virtual) ground plane. In an exemplary embodiment, the BNC surface or panel mount 170 for each conductor 140 is connected to one of the various input channels (e.g., Ch1, Ch2, Ch3, Ch4).

The location of the mounts 170 is at the convenience of the user, for example, on the top or side of the CSA 100g. At the point of connection, the voltages induced by the MR signal are the same in both directions. Thus, in this embodiment the conductor strips 140 are tuned to so as to have a length of one or more times the wavelength (i.e., $L=n\lambda$, where n is an integer, and $\lambda$ is the wavelength corresponding to the frequency that is to be detected). In this way, the sensitivity is uniform at locations equidistant from the strips 140, like that for a traveling wave. Also, because the strip is terminated by itself, the termination 171 is eliminated, thereby avoiding potential losses associated with the termination for a SA antenna configured for a traveling wave.

Figure 7C:
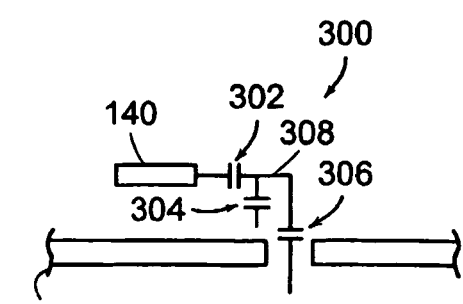
FIG. 7C illustrates is a schematic view of coupling out matching and tuning circuitry for a cylindrical RF strip array with continuous circular conductor strips.

A reactive impedance matching circuit 300, like that capacitor divider circuit shown in FIG. 7C, or other variants as are well known to those skilled in the field and used for matching conventional MR detector devices, is electrically coupled to the surface or panel mount 170 comprising the feed. As shown in FIG. 7C, capacitors 302, 304 are attached in series between a conductor strip 140 and the ground plane 110f. The output connector 170 taps the divider at 308 via a capacitor 306. The capacitor values are chosen such that the length of each conductor strip 140 satisfies the desired value with the CSA 100g loaded with a sample and the impedance at the mount 170 matches that of the cable or the optimum input impedance of the MRI receiver system.

In a further embodiment, and with reference to FIG. 3D, the transverse field CSA 100g further includes a mechanism to limit potential deleterious effects of currents induced in the rings or continuous loops formed by the conductor strips 140 during MR excitation with an external MR coil. In this embodiment, each conductor strip 140 is broken and fitted with a semi-conducting switch such as a low-noise diode (e.g., a PIN diode) or a transistor employed as a switch/diode. A switched DC input voltage (201) is provided by the MR system during MR excitation to bias the semi-conductor off during excitation. During MR reception, the switch is biased to conduct and thereby permit the conductor strips 140 to detect the MR signals.

Referring now to FIG. 7B, there is shown an alternative embodiment of a CSA antenna 100g' according to the fifth aspect that includes a cylindrical ground plane 110f, a cylindrical substrate 120f, a cylindrical overlay 130f, a plurality of conductor strips 140, and a multiplicity of reactive tuning components 150. Reference shall be made to the foregoing discussion regarding FIGS. 1A–D and 6A for the ground plane 110f, the substrate 120f, the overlay 130f, the conductor strips 140, and the reactive tuning components 150 for details thereof not otherwise provided below. Reference also should be made to the foregoing discussion regarding FIGS. 6A and 7A for external connection details for the conductor strips 140 and for the provision of an EM guard.

In this embodiment, the ground pane 110, the substrate 120f, the overlay 130f and the conductor strips are configured and arranged so that a plurality of through apertures 180' are provided that extend from within the interior volume of the CSA antenna 100g' to the exterior of the CSA antenna. In the illustrated embodiment the through apertures 180' extend about the circumference, at least about a portion of the circumference, of the CSA antenna 100g'. In this way, air can flow between the interior volume and the exterior and this also increases the amount of light that can make its way into the interior volume. Although a single aperture is shown on a given circumferential line, it is within the scope of the present invention for a plurality of apertures to be provided on any given circumferential line consistent with structural requirements (e.g., supporting and maintaining conductor strips in spaced relation from each other and the sample being scanned).

In an alternative embodiment for the CSA antenna 100g' illustrated in FIG. 7B, the cylindrical ground plane 110f comprises a plurality or more of sections 112, such as that shown and discussed in connection with FIG. 8 hereinafter. In this case, the through apertures 180' are formed so as to be disposed in the open area between each of the ground plane sections 112 on the inside of the cylinder. In addition, a translucent insulating material can be used for the substrate and overlay so as to increase the amount of light passing through to the interior volume, or alternatively the apertures can extend through the overlay 130f, permitting air flow, and/or providing access for other monitoring equipment or devices being used in conjunction with the detector system.

In yet another alternative embodiment, omitting sections or portions of the ground plane 110 between the conductor strips 140 forms the through apertures 180'. A transparent substrate, such as glass, Plexiglas or the like, is disposed therebetween so as to form a plurality of visualization apertures.

Referring now to FIG. 8, there is shown a perspective view of a near-field RF strip array antenna 100h according to a sixth aspect of the present invention with the insulating substrate 120 and an overlay 130 (not shown for clarity). More particularly there is shown another planar strip array (PSA) antenna 100h that includes a substrate 120, an overlay 130, a plurality of conductor strips 140, and a multiplicity of reactive tuning components 150 (i.e., four per conductor strip). As indicated above, such a PSA antenna 100h also includes a ground plane made up of a plurality of ground plane sections 112, with a ground plane section associated with each conductor strip 140. Dividing or partitioning up the ground plane 110 into sections 112 advantageously limits possible eddy currents that may deleteriously be induced in the ground plane during MR excitation by an external transmitter coil. Reference shall be made to the foregoing discussion regarding FIGS. 1A–D for further details of the ground plane 110, the substrate 120f, the overlay 130f, the conductor strips 140, and the reactive components 150 not otherwise provided below.

According to this aspect of the present invention, the plurality of conductor strips 140 and the multiplicity of reactive components 150 are arranged so that there are one or more reactive components that are electrically coupled to each conductor strip. Further, the at least one or more reactive components being electrically coupled to a given conductor strip also are electrically coupled to the ground plane section 112 corresponding to that conductor strip.

In more particular embodiments, one ground plane section 112 is provided for each conductor strip 140 comprising the SA antenna 110h. In an alternative embodiment, a ground plane section 112 is provided for a plurality of conductor strips 140, for example, two conductor strips. Each of the ground plane sections 112 are generally sized so as to be larger in length and width than the conductor strip(s) that are being electrically coupled to the ground plane section. Also, and although the strip array antenna 100h illustrated in FIG. 8 is planar in form, it is within the scope of the present invention for the ground plane sections 112 and the corresponding conductor strip(s), to be configured and/or arranged so that the strip array antenna forms a generally arcuate/curved shape or cylindrical shape, or is fabricated of flexible materials, substrates and the like that can be conformed to the shape of the sample, such as a body, under study.

The ground or virtual ground plane sections 112 are electrically coupled to ground or virtual ground portions of the MR or receiver system using any of a number of techniques or mechanisms known to those skilled in the art, including direct connections or in particular, connections via the ground or virtual ground conductors of the leads that are connected to the strip ends 142 (Ch1, Ch2, Ch3, etc). While it is advantageous to break up the ground plane to limit eddy currents during excitation by an external transmitter coil, in more particular embodiments, one or more ground plane sections 112 are electrically coupled to each other using conductive wires, strips, straps, pipes, tape or the like, or where the SA antenna 100h is made using printed circuit board techniques, conducting connections may be printed or etched on the printed circuit board. In other embodiments incorporating the teachings of FIG. 8, and with reference to FIG. 9E, one or more of the ground plane sections 112 are electrically coupled to each other via one or more additional reactive components 159. In particular, reactive components 159 such as capacitors and/or inductors connected between adjacent sections of the ground plane can further be used to control the impedance measured between detector strip pairs, which is a measure of their mutual coupling, with the values of the reactances adjusted to beneficially minimize coupling.

The substrate 120 is configured and arranged so as to be disposed between each of the ground plane sections and the corresponding conductor strip(s) 140. In a more particular embodiment, the substrate 120 is in the form of generally unitary structure such that a single member is disposed therebetween and also provides structural support for the strip array antenna 100h. As indicated above, the substrate 120 also can be configured and arranged so as to include one or more through apertures 180 (FIG. 6B) located between opposing sides of adjacent ground plane sections. The overlay 130 also can be similarly configured so as to form a generally unitary structure or a structure having through apertures corresponding to the location of the through apertures in the substrate.

External connection to each conductor strip 140 is accomplished at the ends 142 thereof. For example, one end 142 of each conductor strip 140 is connected to one of the various input channels (e.g., Ch1, Ch2, Ch3, Ch4) and the other end 142 of each conductor strip is appropriately terminated (e.g., $Z_1$, $Z_2$, $Z_3$, $Z_4$) with a termination 171. These input channels can be formed by the a plurality of BNC surface or panel mounts 170 that pass through the substrate 120 and which connect to the ends of the conductor strips 140 such as is shown in FIGS. 1B, 2B, 3B, and with a connection to the virtual ground sections 112.

In a more particular embodiment, this PSA antenna 100$h$ further includes an EM guard 160 such as that described above in connection with FIGS. 2–3. Thus, reference shall be made to this discussion for further details regarding the disposition, configuration, sizing, termination, activation and deactivation and arrangement of the EM guard 160 and embodiments thereof. As provided in the foregoing discussion the EM guard 160 is configured and arranged so that EM effects from the environment, including effects arising from areas of the object extending beyond the periphery of the antenna, are minimized during detection.

In the foregoing FIGS. 1–8, there is illustrated one technique for adjusting or tuning the apparent electrical length of the conductor strip by using one or more reactive components electrically coupled between a conductor strip and the ground plane. As indicated in the discussion above regarding these figures there also is shown in FIGS. 9A–B various schematic views of a single conductor 140 of a strip antenna array illustrating another technique for adjusting apparent electrical length of a conductor strip without the presence of one reactive tuning components 150 (FIG. 9A) and another technique for adjusting apparent electrical length of a conductor strip with the presence of one or more reactive tuning components (FIG. 9B).

As also indicated in the discussion above, there is shown in FIGS. 9C–E various schematic end views of a strip array antenna illustrating techniques for adjusting and minimizing the coupling between adjacent strips with the addition of reactive coupling components 151 connected between adjacent conductor strips 140 without reactive tuning elements 150 used to tune the length of the strips 140 (FIG. 9C); another technique for adjusting the coupling between conductor strips 140 with reactive coupling elements 151 coupled between adjacent conductor strips and one or more reactive tuning elements 150 used to tune the conductor strips 140 (FIG. 9D); and yet another technique for adjusting the coupling between conductor strips 140 with reactive coupling elements 151 coupled between adjacent strips, reactive elements 159 coupled between adjacent ground plane sections 112 and one or more reactive tuning elements 150 used to tune the conductor strips 140 (FIG. 9E). Reference shall be made to the foregoing discussion for these figures and more particularly FIGS. 1A–D for further details of the strip configurations shown in FIGS. 9A–B.

There also is described in U.S. Ser. No. 09/822,771, the teachings of which are incorporated herein by reference, a number of planar strip array antennas in which the substrate and overlay are made of materials having certain characteristics so as to make the EM wave on a given conductor strip 140 lie within an acceptable range for purposes of detecting MR signals. It should be recognized, that it is within the scope of the present invention however, that such planar strip array antennas are configurable so as to include one or more (e.g., a plurality) reactive elements (capacitor and/or inductor), with at least one inductor element for each conductor of that planar strip array antenna. Also, each conductor 140 can be configured and arranged so as to comprise a plurality of conductor strip members 146, where an inductor element 158 is arranged so as to electrically couple each pair of said plurality of conductor strip members 148. Further, at least one reactive coupling element can be electrically coupled between each pair of adjacent conductor strips.

There is disclosed in U.S. Ser. No. 09/822,771 entitled "APPARATUS FOR MAGNETIC RESONANCE IMAGING HAVING A PLANAR STRIP ARRAY ANTENNA INCLUDING SYSTEMS AND METHODS RELATED THERETO" a new type of phased-array detector, a planar strip array antenna, and techniques for configuring and arranging components thereof so as to substantially reduce coupling of an EM signal on one conductor strip to an adjacent conductor strip(s). More particularly, it is described therein that each of the conductor strips of such a strip array has a length "l" that is particularly set or tuned such that conductor strips operate in a standing or a traveling wave EM mode, permitting their use for detection of NMR signals. In the case where the EM signal on each conductor strip is a standing wave, the length of each conductor strip is set so as to be equal to be about $n\lambda/4$, where n is an odd integer $\geq 1$ and $\lambda$ is the wavelength of the signal to be detected. For MRI applications, $\lambda$ is the wavelength corresponding to the NMR frequency of the nuclei being studied in a given main magnetic field. In the case where the EM signal on each conductor strip is a traveling wave, it is provided that the length of each conductor strip is set so as to be equal to be about $n\lambda/4$, where n is an even integer $\geq 1$; in a more specific embodiment, n=2.

It also is provided therein that such a strip array antenna having conductor strips with such lengths yields an array in which there is a significant reduction in signal coupling between adjacent conductor strips in a narrow frequency band, for example, a frequency band about the NMR frequency. Such a significant reduction is established substantially independent of the spacing "s" between adjacent conductor strips, the width ("w") of the conductor strips, or the thickness of the conductor strips. More specifically, the signal coupling is so reduced over the narrow frequency band that the adjacent conductor strips are in effect decoupled from each other.

In addition it is provided therein that for a standing wave type SA antenna, one end of each conductor strip is terminated as one of an open circuit or a short circuit. The standing wave caused by the high reflection from such termination, can significantly increase the signal power and thereby provide a good SNR. For a traveling wave type SA antenna, one end of each conductor is terminated with a matched load impedance.

In another aspect, it is provided therein that the strip array is configured and arranged so as to provide broadband de-coupling. Such decoupling is related or dependent upon "s", the spacing between conductor strips, and "h", the height or overall thickness of the encapsulating member comprising the substrate and the overlay (i.e., h=thickness of substrate+thickness of overlay). It is shown graphical therein, that when the ratio of the strip spacing to the height of the encapsulating member (s/h) is about 2.5 or greater (i.e., s/h≧about 2.5), there is decoupling of the adjacent conductor strips and when s/h is about 3 or greater, adjacent conductor strips 140 are essentially decoupled from each other irrespective of the length "L" of the conductor strip.

While the foregoing disclosures and teachings set forth broad design and principles for achieving substantial reductions in narrow and broadband decoupling between adjacent conductors of a strip array antenna, there is a need to expand upon such teachings and principles so that one can achieve such decoupling between adjacent conductor strips while at the same time provide an antenna whose geometry can be optimized to accommodate a number of different sample sizes and geometries for a given NMR frequency, and in particular, to provide optimum SNR. As such, according to the broadest aspects of the present invention, and in the case where one or more reactive tuning components 150 are electrically coupled to each conductor strip 140, the length L, of each conductor strip 140 is first chosen to optimize the NMR performance for the particular geometry of the sample and region of interest or organ to be imaged. More specifically, the length (L) of the conductor strip 140 is in general first chosen so as to optimize SNR performance for a specific depth, "d", or range of depths in the body or sample being scanned, and will typically fall in the range $0.5d \leq L \leq 5d$, or otherwise will be comparable to the field-of-view (FOV). The value or characteristic value of each of the one or more reactive tuning components 150 is then adjusted so as to tune the pre-selected length of the conductor strip 140 so that the apparent electrical length of each conductor strip satisfies the above-described condition for the traveling or standing wave strip array antenna.

In the case of a tunable standing wave SA antenna, the value or characteristic value of each of the one or more reactive tuning components 150 is set or tuned so that the apparent electrical length of each conductor strip 140 is substantially equal to about $n\lambda/4$, where n is an odd integer $\geq 1$ and $\lambda$ is the wavelength of the signal to be detected, for example, the wavelength corresponding to the NMR frequency. In specific embodiments n=1 and n=3. In the case of a tunable traveling wave SA antenna, the value or characteristic value of each of the one or more reactive tuning components 150 is tuned so the apparent electrical length of each conductor strip 140 is substantially equal to be about $n\lambda/4$, where n is an even integer $\geq 1$; in a more specific embodiment, n=2. In this way, the value or characteristic value of the one or more reactive tuning components 150 tunes each conductor strip, 140, so that the strip, and thus the strip array antenna 100, is capable of detecting EM waves and/or NMR signals with a desired wavelength or frequency.

The following example is provided to further describe the foregoing tuning process for a tunable standing wave SA antenna according to the present invention for NMR detection or MR imaging of protons ($^1$H) in the adult human heart at 63.88 MHz in a 1.5 Tesla magnetic field. The depth of the heart is typically about 5–15 cm from the chest surface and a potential external detector, and a detector of length 10–20 cm will provide good SNR. However, as noted earlier, $\lambda/4$ for 63.88 MHz is about 117 cm in air and about 46 cm in a glass dielectric strip array antenna. These lengths are too long to provide an optimum SNR for the heart because the extra length adds more noise than signal.

Instead lets use conductor strips having a length of about 15 cm. This length "L", however, is too short to satisfy the $\lambda/4$ criterion when using a glass substrate or a material with a comparable or lower dielectric constant like many plastics. Thus, and in accordance with the present invention, the 15 cm conductor strip length is tuned to $\lambda/4$ (or $n\lambda/4$) by adding one or more reactive tuning components 150 (e.g., capacitors) until the electrical length measured at the ends is $\lambda/4$ (or $n\lambda/4$), as evidenced, for example, by a maximum impedance at the MR frequency observed at the mount 170 using a vector impedance meter or network analyzer, and the conductor strip terminated with an open circuit. This process is analogous to tuning $\lambda/4$ cables, as is known to those skilled in RF electronics and the like, except that the length is tuned with the use of tuning elements instead of physically trimming the length of the cable. Similarly, to make a tunable travelling wave SA antenna in accordance with the present invention, the 15 cm conductor strips 140 would be tuned to $\lambda/2$ (or $\lambda, \ldots n\lambda/2$), analogous to tuning $\lambda/2$ cables as is known to those skilled in the art, except by using one or more reactive tuning components 150, instead of tuning the physical length of the cable.

In a further embodiment, and from a SNR stand-point, the plurality of conductor strips 140 in a tunable SA antenna are spaced with a spacing "s" from each other by an amount comparable or less than the length of the conductor strip, and more particularly, in the range, $L/10 \leq s \leq 2L$ in order to provide sensitivity to regions spanning the dimensions of the SA antenna in the dimensions perpendicular to the long axis of the conductor strips. Note, however, that values of s below the lower limit may be desirable for the purposes of sensitivity encoded MRI (SMASH, SENSE and the like as discussed above). With s=L/2=7.5 cm for example, the condition $s/h \geq 2.5$ is satisfied with thickness $h \leq 3$ cm, although it may be desirable to adjust h to affect the depth sensitivity of the strip array antenna.

It also is generally desirable to position a detector as close as possible to the organ of interest, in this case the heart and thus, in another embodiment, a detection device according to the present invention is fabricated on a flexible substrate such as a flexible low-loss plastic polymer, or foam. Thus, in an illustrative exemplary embodiment the ground plane 110 and conducting strips 140 having a length of 15 cm are fabricated on two sheets of flexible printed circuit board affixed to opposite sides of a closed (e.g., non-sponge) 2–3 cm thick foam with reactive tuning components 150 (i.e., capacitors) penetrating the foam to the opposite surface. The conductor strips 140 and ground plane 100 are printed on the circuit board, and both sides are covered with an insulating substrate. The conductor strips 140 are tuned with the SA antenna in contact or loaded with a typical subject. In a simple exemplary form, the $\lambda/4$ conductor strips of the standing wave SA antenna are terminated with an open impedance 171 and cable connections made to the mount 170. In other embodiments to improve overall uniformity, adjacent conductor strips 140 are alternately terminated with short and open circuits. For a travelling wave SA antenna, the $\lambda/2$ conductor strips 140 are terminated with the characteristic matched resitive load (e.g., 50 ohms) and cable connections made to the far end. In other embodiments to improve sensitivity, the $\lambda/2$ strips are terminated with a capacitor in series and a capacitor and inductor pair in parallel, the latter being tuned to the resonance frequency with the series capacitor adjusted so that the impedance of the reactive circuit is equal to the characteristic impedance (e.g., 50 ohms ($\Omega$)).

CSA antenna designs for NMR applications will typically be designed for the head, the limbs, whole torso or for animal studies. A head-sized CSA antenna for example, may be about 25 cm in diameter leading to a 79 cm circumference. In the above example, $\lambda/4$ for 63.88 MHz is about 117 cm in air and about 46 cm for a glass dielectric planar strip array antenna. A head coil with 46 cm long conductor strips parallel to the cylindrical axis is too long for optimum NMR studies or the head. A more suitable strip length of 20–25 cm or less would permit coverage of the whole head. The 20–25 cm strips are tuned to $\lambda/4$ using the reactances of the reactive tuning components 150, or more specifically, the capacitors as described above.

For a transverse field CSA antenna having conductor strips in the form of continuous loops (FIG. 7A, 7B) that is to meet the $n\lambda$ criterion discussed above, the circumference of 79 cm is still shorter than the wavelength of 184 cm exemplified by the planar SA antenna with a glass dielectric. Thus, such a CSA antenna is built having the desired diameter for optimal coverage for the head, and the 79 cm circumference loops are tuned to $\lambda$ (or $n\lambda$) using the reactive elements 150 as described above.

In the above examples the desired strip lengths are significantly shorter than the $\lambda/4$ and $\lambda$ tuning criteria based on the wavelength in the strip conductors and substrate and capacitors are exemplified for use as the reactive tuning components/elements. It will be understood by those skilled in the art that other situations may arise where inductive elements are appropriate to use as the reactive tuning components 150. For example, in the case, at high NMR frequencies and relatively large sample sizes where the desired length is longer than that prescribed by the tuning criteria. In this situation a planar SA antenna that tunes solely by the dielectric material overlay and substrate would yield a SA antenna that is too short. The tuning of the tunable SA antenna with inductive elements in this case would proceed in the same fashion as described above, except that the inductances are adjusted, instead of the capacitors, to meet the tuning criteria.

As shown in FIG. 9A, the length of the conductor strips 140 comprising a SA antenna also is tunable to a desired wavelength using one or more inductors elements 158 and where the conductor strip 140 also is configured so as to comprise a plurality or more of conductor strip members 146 or segments. In this case, each of the inductor elements 158 electrically couples a pair of conductor strip members 146 and the value or characteristic value of each of the inductor elements is set so as to establish an apparent electrical length for each conductor strip 140 that substantially reduces the coupling of an electromagnetic (EM) signal on one conductor strip from being coupled to an adjacent conductor strip(s). In the case where the EM signal on each conductor strip 140 is a standing wave, the length of each conductor strip and the value or characteristic value of each of the one or more inductors 158 are set so the apparent electrical length of each conductor strip is equal to be about $n\lambda/4$, where n is an odd integer $\geq 1$ and $\lambda$ is the wavelength of the signal to be detected. In the case where the EM signal on each conductor strip 140 is a traveling wave, the length of each conductor strip and the value or characteristic value of each of the one or more inductors 158 are set so the apparent electrical length of each conductor strip is set so as to be equal to be about $n\lambda/4$, where n is an even integer $\geq 1$; in a more specific embodiment, n=2. In the present embodiment, the length of the conductor strip 140 shall be understood to mean the total of the individual lengths of each conductor member 146.

As shown in FIG. 9B, and in addition to the inductor elements 158 referred to above, reactive tuning components 150 are utilized to further tune the apparent electrical length of each conductor strip 140 that is made up of a plurality of more of conductor members 146. In this particular embodiment, the value or characteristic value of each of the one or more inductors 158 and the one or more reactive components 150 is set so as to establish an apparent electrical length for each conductor strip 140 that substantially reduces the coupling of an EM signal on one conductor strip from being coupled to an adjacent conductor strip(s). In the case where the EM signal on each conductor strip 140 is a standing wave, the length of each conductor strip and the value or characteristic value of each of the one or more inductors 158 and the one or more reactive components 150 are set so the apparent electrical length of each conductor strip is equal to be about $n\lambda/4$, where n is an odd integer $\geq 1$ and $\lambda$ is the wavelength of the signal to be detected. In the case where the EM signal on each conductor strip 140 is a traveling wave, the length of each conductor strip and the value or characteristic value of each of the one or more inductors 158 and the one or more reactive components are set so the apparent electrical length of each conductor strip is set so as to be equal to be about $n\lambda/4$, where n is an even integer $\geq 1$; in a more specific embodiment, n=2.

Where it is desirable to further reduce coupling between strips by deploying reactive coupling components 151 electrically coupled between adjacent conductor strips 140 and/or reactive elements 159 electrically coupled between ground/virtual ground plane sections 112, as discussed above in connection with FIGS. 9C–E, these reactances may be determined in general by applying a sinusoidal voltage signal tuned to the detection frequency to at least one conductor strip 140, and adjusting the reactances to minimize the signal observed on at least one adjacent strip. For example capacitors may be deployed as the reactive coupling components 151 for the 1.5 Tesla tunable cardiac SA antenna above. Thus, by this means, the value or characteristic value of each of the one or more capacitors is set so as to substantially further reduce the coupling of an EM signal on one conductor strip 140 from to an adjacent conductor strip(s).

It is noted that under certain circumstances that adjustment of the reactive coupling components and/or reactive elements 151, 159 may affect the tuning of the conductor strips 140 to the various $n\lambda/4$ conditions. In such cases, the values of the reactive tuning components 150 are re-adjusted to satisfy the $n\lambda/4$ criteria. In the present embodiment, the length of the conductor strip 140 shall be understood to mean the total of the individual lengths of each conductor member 146. It is further noted that the magnitude of the coupling and the value of the reactive coupling components 151 and/or reactive elements 159 that are connected between adjacent conductor strips 140 also depend upon the choice of strip spacing "s", and in particular, coupling is generally reduced as "s" increases.

In the various figures of the subject application, the conductor strips 140 are drawn or illustrated with substantially equal lengths, and the reactances for the reactive tuning and coupling components are depicted as characteristic or comparable values, however, these depictions are not intended to be restrictive. In particular, because the present invention enables the strip length to be chosen by the user, typically based on performance criteria, it is within the scope of the present invention to provide tunable SA antenna detectors wherein the strip length is significantly different within each SA, and wherein the substantially different strip length are tuned to satisfy the appropriate $n\lambda/4$ with different values of the tuning reactances and different values of coupling reactances. For example, it is within the scope of the present invention for a strip array antenna for a torso to be configured and arranged with longer conductor strips at the center of the chest, and shorter conductor strips at the sides to provide space for the arms. In addition it is within the scope of the present invention to provide SA detectors that combine both standing and travelling wave SA detectors. More specifically, it is within the scope of the present invention to provide SA detectors wherein at least one conductor strip of an array satisfies the $n\lambda/4$ criterion for the standing wave SA, with n an odd integer, and at least one other conductor strip of the array satisfies the $n\lambda/4$ criterion for the travelling wave SA antenna, with n an even integer, and $\lambda$ is the wavelength corresponding to the detection frequency or the NMR frequency of the nuclei being studied in a given main magnetic field.

In addition, to establishing the length for each conductor strip capable of detecting an EM signal having a desired wavelength or frequency using any of the foregoing described techniques, the length of each conductor strip also is set so as to optimize performance when scanning a sample or region of interest of a given size. As is generally known to those skilled in the art, the maximum possible SNR realized at a given depth within a sample depends on the physical size of the detector. As such, according to one embodiment of the present invention, the physical length "L" of each conductor strip 140 is set so as to correspond to a length that maximizes SNR at a given depth, "d", or range of depths of a region of interest in the body or sample being scanned, and will typically fall in the range $0.5d \leq L \leq 5d$ within a sample. It also is contemplated in another embodiment that the physical length of the conductor strip 140 is generally chosen so as to approximately correspond to the largest dimension of the FOV measured to the surface where the SA antenna 100 would be placed. It also is contemplated in yet another embodiment, that the spacing "s" between conductor strips 140 is chosen or selected so that the dimension of the array measured between the first and last conductor strips is comparable to the size of the region on interest in this dimension.

After selecting the physical length of the conductor strip 140 for purposes of optimizing performance for a region of interest, the value or characteristic value of the reactive tuning components 150 and/or the reactive coupling components 151 and/or reactive element 158 is selected or set so the combination of the selected physical length and the characteristic value of these one or more reactive components yield an apparent electrical length for the conductor strip 140 that can detect the signal of interest while substantially reducing signal coupling between adjacent conductor strips as hereinabove described. In sum, in the present invention the apparent electrical length of each conductor strip 140 alone or in combination with the spacing of the conductor strips is tuned using any of a number of techniques and methodologies described herein so as to be optimally capable of detecting a signal of a given wavelength or frequency from a given region of interest while minimizing signal coupling between adjacent conductor strips.

Figure 10A:
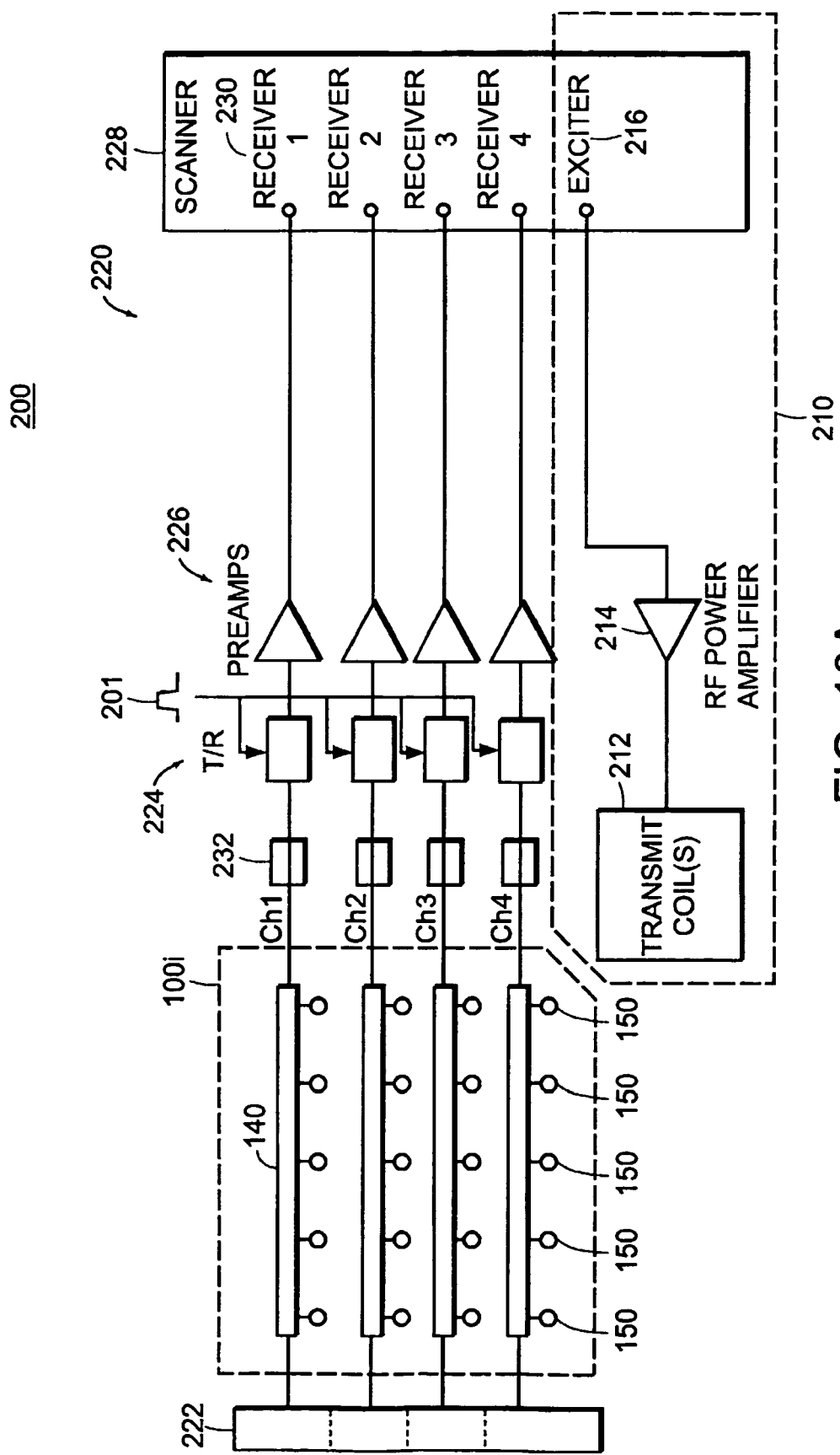
FIG. 10A is a schematic view of an exemplary RF excitation and MR signal detection sub-system of an MRI system for detecting MR signals of excited hydrogen nuclei.

Now referring to FIG. 10A, there is shown a schematic view of an exemplary RF excitation and NMR signal detection apparatus 200, or subsystem of an MRI system, for detecting MR signals of excited hydrogen ($^1$H) nuclei, including an RF excitation portion 210 and an MR signal detection portion 220. The RF excitation portion 210 includes transmitter coil(s) 212, a power amplifier 214 and an exciter 216. The transmitter coil(s) 212 are any of a number of transmitter coil designs, arrangement and/or configuration known to those skilled in the art. In an illustrative embodiment, the transmitter coils is a standard, whole-body cylindrical "birdcage" MRI coil that fits within the bore of the MRI system's magnet with cylindrical axis substantially parallel with the long axes of the conductor strips 140 comprising the SA antenna 100i and the main field of the magnet. The power amplifier 214 is any of a number of power amplifiers known to those skilled in the MRI arts for amplifying the RF signal being outputted via the transmitter coils 212 to excite the nuclei with the section being scanned of the patient or the object to be scanned, for example a gated 15 kW pulsed RF power amplifier. The exciter 216, as is known to those skilled in the art, is a subsystem that generates the RF waveform that is fed into the power amplifier under computer control.

The MR signal detection portion 220 includes a SA antenna 100i according to the present invention, a plurality of terminations 222 one for each conductor strip 140, a plurality of transmit/receive switches 224 one for each conductor strip, a plurality of preamplifiers 226 and a scanner 228 including a plurality of receivers 230. Although the SA antenna 100i illustrates yet another embodiment in which five reactive components 150 are electrically coupled to and between each conductor 140 and the ground plane 110, this shall not be construed as a limitation. Any SA antenna according to the teachings of the present invention including any of the other above-described SA antenna embodiments, including those with cylindrical geometries (FIGS. 6–7) can be used with the MR signal detection portion 220. Reference also should be made to the foregoing discussions regarding FIGS. 1–8 for components or any details or information not otherwise provided hereinafter.

The transmit/receive (T/R) switches 224 are any of a number of devices known to those skilled in the art that selectively couple and de-couple each conductor strip 140 from the corresponding preamplifier 226. Such decoupling and coupling is responsive to a signal 201 provided to each of the T/R switches 224. In MRI applications, de-coupling is typically done during the time period when the RF excitation portion 210 is to output the RF excitation signals and such coupling is effected when RF excitation signals are not being generated, more particularly during the time period when MR signals are to be detected. In an illustrative embodiment, the T/R switch 224 is in the form of a diode that is configured and arranged so that it receives a forward bias such that the diode becomes a short circuit when transmitting or outputting the RF excitation signals. In a more particular embodiment, the diodes are physically located on the SA antenna 100i and are connected each one across the proximal reactive tuning element 150 for each conducting strip 140. When the diode is activated in this embodiment, the reactive tuning element 150 is shorted, detuning the conductor strip 140 such that it no longer satisfies the $n\lambda/4$ criterion.

The preamplifiers 226 are any of a number of low noise devices or preamplifiers known to those skilled in the art, that amplify the MR signal detected on each of the conductor strips 140 to a level such that the scanner receiver can receive and process the inputted signal(s). In an illustrative embodiment, the preamplifiers 224 are 1.5 Telsa preamplifiers as manufactured by General Electric Corporation, with noise figures of 0.2–0.4 dB at 63.88 MHz and each with the same gain of about 30–40 dB.

The scanner receivers 230 are any of a number of devices known to those skilled in the art that can receive an RF signal at the desired frequency. Such a scanner receiver 230 also includes the capability of down-converting the received RF signal into a lower frequency quadrature (I and Q) signal. In a more particular embodiment, the scanner receiver 230 further includes an analog to digital (A/D) converter as is known in the art that converts the quadrature analog lower frequency signal into a digital signal that is sent to memory. In an illustrative embodiment, the scanner receiver is any one of a number of such receivers manufactured by General Electric Corporation, Siemens Medical Systems or Philips Medical Systems.

The terminal end of each conductor strip 140 is electrically interconnected to circuitry comprising the termination 222, which includes the termination 171 above for each conductor strip 140. For a standing wave type of SA antenna, the circuitry of the termination 222 is configured and arranged such that the terminal end is one of an open circuit or a short circuit. In another embodiment, the circuitry comprising the termination 222 is configured and arranged so that the terminal end of one of the odd numbered or the even numbered conductor strips 140 is one of an open circuit or a short circuit. In addition, the circuitry comprising the termination 222 is configured and arranged so that the terminal end of the other of the odd numbered or the even numbered conductor strips 140 is the other of an open circuit or a short circuit termination. Stated another way, the circuitry comprising the termination 222 is configured and arranged so that the termination 171 for each conductor strip 140 alternates between an open circuit and a short circuit.

In the case of the traveling wave type of SA antenna, the termination 222 includes circuitry that is a resistive match to the impedance of each conductor strip. In an illustrative embodiment, the width, spacing and height of the encapsulation are selected such that the characteristic impedance (i.e., Zo) of the conductor strip 140 is about 50 ohms. In this case, the circuitry of the termination 222 would be configured so that the terminal end of each conductor cable has matching impedance. In its simplest form, this could be a 50 ohm ($\Omega$) resistor as exemplified in U.S. Ser. No. 09/822,771. Alternatively, and more beneficially the circuitry of the termination for each conductor strip comprises a capacitor in series with a capacitor and inductor pair in parallel, the latter being tuned to the resonance frequency with the series capacitor adjusted so that the impedance of the reactive circuit is equal to the characteristic impedance, e.g., 50 $\Omega$. Alternatively, the circuitry for the termination 222 of each conductor strip 140 comprises a capacitor connected between an end 142 of the conductor strip and ground, wherein the capacitance value is adjusted such that the impedance in conjunction with the inductance of the conductor strip to which it is connected, matches the desired characteristic impedance. It is within the skill of those knowledgeable in the art to provide the foregoing described circuitry of/comprising the termination 222. It should be noted that although the termination 222 is drawn separately in FIG. 10 for illustrative purposes, it is within the scope of the present invention for the circuitry comprising the termination to be arranged so as to be an integral part of the SA antenna so as to minimize losses. As noted above in the case of the continuous loop CSA 100g, 100g' (FIG. 7A-B), the termination is eliminated altogether.

The feed point of each conductor strip 140 is electrically connected to a corresponding one of the preamplifiers such that the MR signal (s) detected by the conductor strip is communicated or transmitted to the preamplifier and thence onto the corresponding one of the receivers 230. The electrical interconnection between the conductor strip 140 and the corresponding preamplifier 226 can further included circuitry 232 to couple the detected MR signal out of the conductor strip and to the receiver 230 with minimum losses. For a traveling wave type of SA antenna such coupling out circuitry is typically not required because the termination and input impedance at the feeding point are typically about the same. For the continuous loop CSA, matching and tuning circuitry can be incorporated at the input 170, using standard circuitry as shown in FIG. 7C.

Because of the open or short circuit termination of the conductor strip 140, the direct coupling of the detected MR signal from the conductor strip to a corresponding preamplifier 224 may be inefficient. Thus, circuitry 232 may be provided in the electrical interconnection from the feed point of the conductor strip 140 to improve efficiency and therefore performance, and includes for example circuitry in the form of a reactive device that is configured or arranged to couple the signal to the preamplifier 226. More specifically, the circuitry 232 for coupling out the detected MR signal comprises one of series capacitor or a shunt inductor for respectively one of a short or open termination of the conductor strips.

Also, because the input impedance at the feeding point is either close to zero (for an open termination) or very large (for a short termination), it is desirable to further match the network. Such matching can be accomplished using any of a number of techniques known to those skilled in the art, while taking the following considerations into account. Firstly, the matching network should be configured and arranged such that the output reflection coefficient of the receiver channel at the feeding point is not in the region of ½ in the case of a short termination or −½ in the case of an open termination. In the case where the impedance at the feeding point is close to zero, the matching network should be configured or arranged such that the output reflection coefficient of the receiver channel is made close to zero. In this way, suppression of the standing wave is avoided. Finally, additional information regarding selection of capacitors or inductors and series and shunts for the matching network 232 is provided in Lee et al in Magn Reson Med 2001; 45: 673–683, and in U.S. Ser. No. 09/822,771 "APPARATUS FOR MAGNETIC RESONANCE IMAGING HAVING A PLANAR STRIP ARRAY ANTENNA INCLUDING SYSTEMS AND METHODS RELATED THERETO", owned by the assignee of the subject patent application and incorporated in its entirety by reference herein. While termination 222 and coupling circuitry 232 are illustrated or depicted as separate from the SA antenna 100i in FIGS. 10A–C, this is not a limitation. In particular, it is within the scope of the present invention and thus an embodiment thereof to incorporate termination 171 in termination 222 and/or matching/coupling means 232 directly into or within the structure of SA, 100i so as to minimize leads and connections.

Figure 10B:
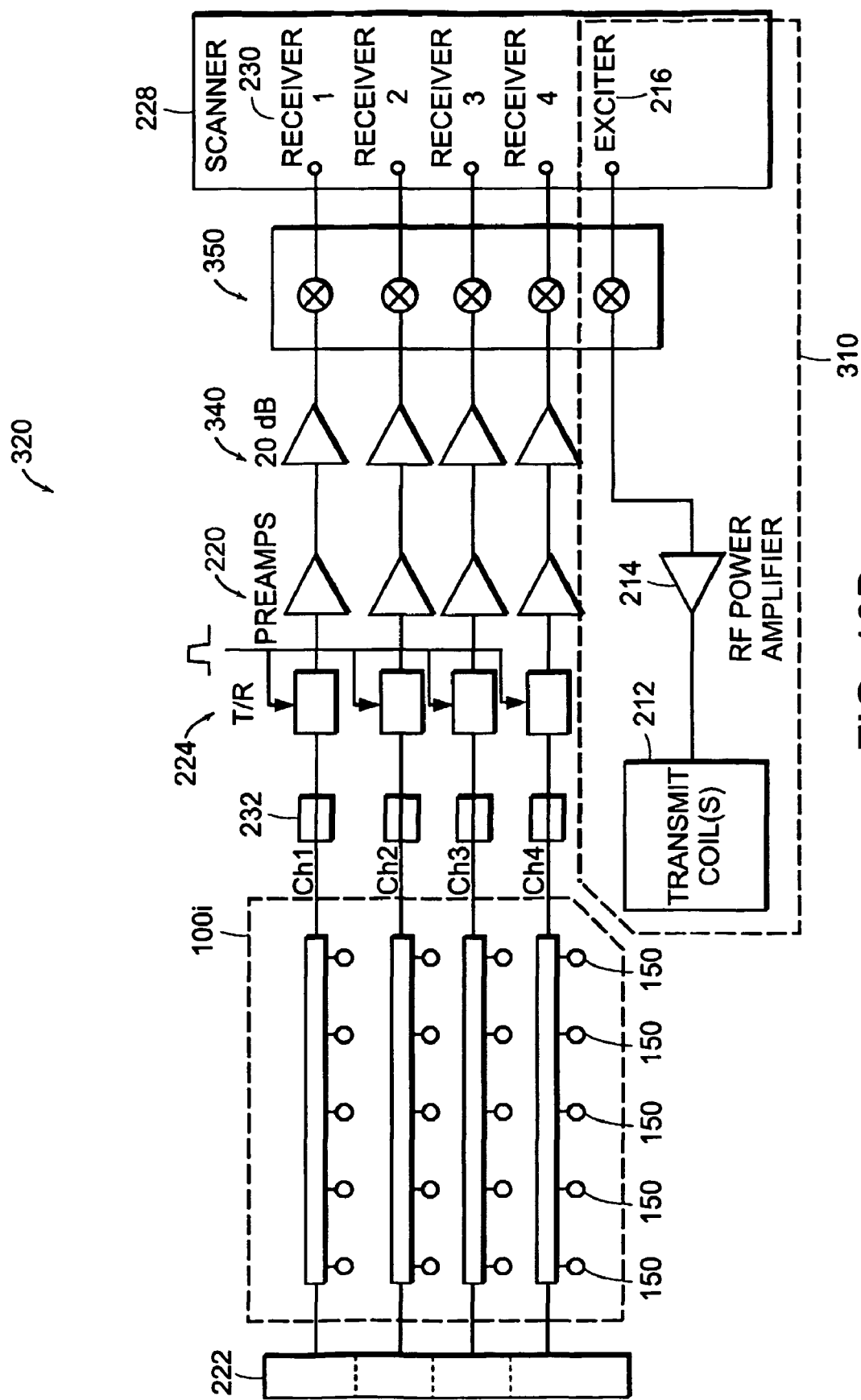
FIG. 10B is a schematic view of another exemplary RF excitation and MR signal detection sub-system of an MRI system for detecting MR signals of other excited nuclei such as sodium.

Now referring to FIG. 10B, there is shown a schematic view of an exemplary RF excitation and MR signal detection apparatus 300, or subsystem of an MRI system, for detecting MR signals of other excited nuclei such as sodium or phosphorus. The RF excitation and MR signal detection apparatus 300 more particularly includes an RF excitation portion 310 and an MR signal detection portion 320. The RF excitation portion 310 includes transmitter coil(s) 212, a power amplifier 214 and an exciter 216, however, the RF excitation portion also is configured or arranged so as to output an RF signal at the appropriate resonance frequency for the nuclei to be excited. Reference shall be made to the foregoing discussion for FIG. 10A for other details regarding the components comprising the RF excitation portion 310.

The MR signal detection portion 320 includes a SA antenna 100i according to the present invention, a plurality of terminations 222 one for each conductor strip 140, a plurality of transmit/receive switches 224 one for each conductor strip, a plurality of low-noise preamplifiers 226 optimized for the frequency of the selected nucleus, a plurality of second amplifiers 340, a frequency converter 350 and a scanner 228 including a plurality of receivers 230. Reference should be made to the foregoing discussions regarding FIGS. 1–8 and 10A for components or any details or information not otherwise provided hereinafter.

Typically the MR signals being detected from such other nuclei are weaker than the MR signals from excited hydrogen nuclei. As such, the MR signal detection portion 320 of this embodiment includes a plurality of second amplifiers 340 that further amplify the signal output from the plurality of preamplifiers. These second amplifiers 340 are any of a number of devices or amplifiers known to those skilled in the art, that amplify the signal outputs from the preamplifiers 226 to a level such that the scanner receiver 230 can receive and process the inputted signal(s). In an illustrative embodiment, each of the plurality of second amplifiers 340 is a 20 dB gain broadband low power amplifier such as those used for broadband spectroscopy on a commercial MRI scanner.

Typically the MR signals being detected from such other nuclei have a different resonance frequency than that for excited hydrogen nuclei and the receivers 230 for receiving the MR signals are typically tuned to the resonance frequency for excited hydrogen nuclei. As such, the MR signal detection portion 320 of this embodiment includes a frequency converter 350 as is known to those skilled in the art that converts the signals having the resonance frequency of the other nuclei to the resonance frequency for excited hydrogen nuclei so these signals can be received by the plurality of receivers 230. In an illustrative embodiment, the frequency converter 350 is a broadband mixing unit which itself is an assemblage of discrete amplifier, mixer and filter components available from MiniCircuits Inc. (MO USA). Alternatively, the scanner 228 can be configured with a plurality of receivers tuned to the resonance frequency of the other nuclei or with broad-band receivers such that the frequency converter can be dispensed with.

Figure 10C:
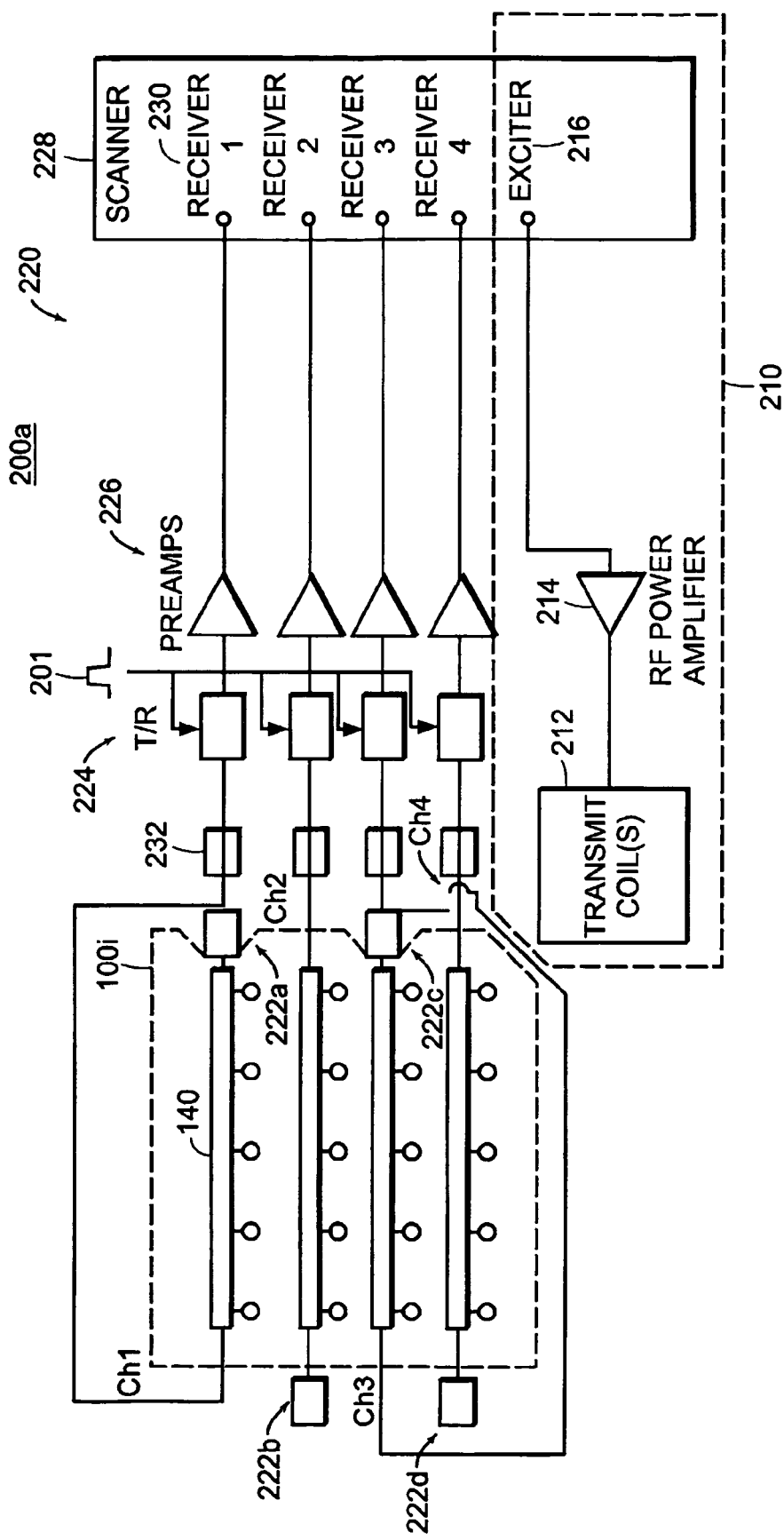
FIG. 10C is a schematic view of the exemplary RF excitation and MR signal detection sub-system of FIG. 10A but configured so that ends of the conductor strips are connected alternatively to the receiver.

Now referring to FIG. 10C, there is shown a schematic view of an exemplary RF excitation and MR signal detection apparatus 200a, or subsystem of an MRI system, for detecting MR signals of excited hydrogen nuclei, including an RF excitation portion 210 and an MR signal detection portion 220. This exemplary apparatus 200a is an alternate embodiment of the RF excitation and MR signal detection apparatus 200 of FIG. 10A. Thus, reference shall be made to the discussion of FIGS. 1–8 and FIGS. 10A–B for details not otherwise provided below.

According to this embodiment or aspect of the present invention, alternate ends of the conductor strips 140 are connected respectively to the plurality of terminations 222 and the plurality of transmit/receive switches 224. In an exemplary illustrative embodiment, where each conductor strip has a first and a second end, the first end of the odd numbered conductor strips and the second end of the even numbered conductor strips are connected to one of the plurality of terminations 222a–d. Also, the second end of the odd numbered conductor strips and the first end of the even numbered conductor strips are electrically coupled to the scanner receiver 230 of the appropriate channel (e.g., Ch1, Ch2, Ch3, Ch4) and visa-versa. For a standing wave type of SA antenna, the circuitry of each of the plurality of terminations 222a–d is configured and arranged such that the terminal end is one of an open circuit or a short circuit. In another embodiment, the circuitry comprising the plurality of terminations 222a–d is configured and arranged so that the terminal end of one of the odd numbered or the even numbered conductor strips 140 is one of an open circuit or a short circuit. In addition, the circuitry comprising the plurality of terminations 222a–d is configured and arranged so that the terminal end of the other of the odd numbered or the even numbered conductor strips 140 is the other of an open circuit or a short circuit. Stated another way, the circuitry comprising the plurality of terminations 222a–d is configured and arranged so that the terminal end alternates between an open circuit and a short circuit. For example, the first conductor termination 222a and the third conductor termination 222c is configured as an open circuit and the second conductor termination 222b and the fourth conductor termination 222d is configured as a short circuit or visa-versa. In the case of the traveling wave type of SA antenna, the plurality of terminations 222a–d includes circuitry that matches the impedance of each conductor strip 140.

Figure 11:
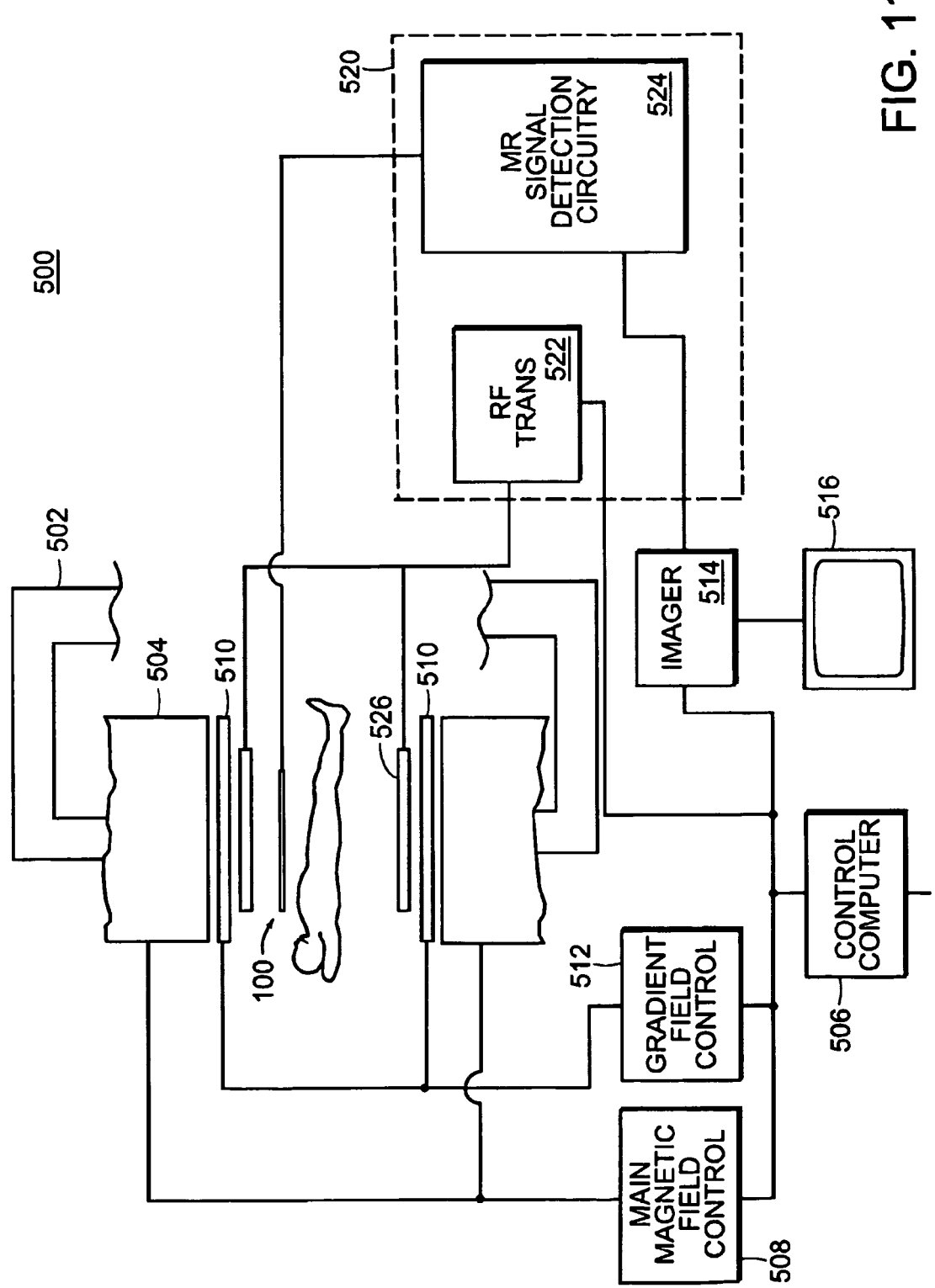
FIG. 11 is a schematic view of an exemplary magnetic resonance imaging (MRI) system having an RF excitation and MR signal detection apparatus according to the present invention.

Referring now to FIG. 11 there is shown a schematic view of an exemplary MRI system 500 having a RF excitation and MR signal detection apparatus according to the present invention. Although the RF excitation and MR signal detection apparatus 200 of FIG. 10A is referred to in the illustrated embodiment, this shall not comprise a limitation and other RF excitation and MR signal detection apparatus in accordance with the teachings of the present invention are contemplated for use in such an MRI system. Additionally, although a MRI system having a main magnet comprising a C-type magnet is illustrated, this also shall not constitute a limitation as it is with the contemplated scope of the present invention to adapt any of a number of known MRI magnets including superconducting magnet systems so as to be capable of using the RF excitation and MR signal detection apparatus of the present invention. Other exemplary MRI magnet systems are found in U.S. Pat. No. 4,689,563, the teachings of which are incorporated herein by reference.

The MRI system 500 includes an electromagnet 502, a computer 506, a main magnetic field control 508, a gradient coil sub-system 510, gradient magnetic field power amplifiers 512, an imager 514, a display device 516 and a RF excitation and MR signal detection apparatus 520 according to the present invention.

The electromagnet 502 produces a strong main magnetic field Bo in which a body 2 to be imaged, a patient, is placed on a suitable support or table (not shown). The strength of the magnetic field in the gap between the pole pieces 504, and hence in the body 2, is controlled by a computer 506 via a main magnetic field control 508, which controls the supply of energizing current to the electromagnet energizing coil. Alternatively, for superconducting MRI electromagnets, with inherently highly-stable fields, the field is charged and set to an exact value upon installation, and not altered during normal operation.

The gradient coil sub-system 510, comprising one or more gradient coils, whereby a magnetic field gradient can be imposed on the static magnetic field in the sample volume in any one or more of three orthogonal directions X, Y, and Z. The gradient coil sub-system 510 is energized by a gradient field power amplifiers 512 that are under the control of the computer.

The RF excitation and MR signal detection apparatus 520 according to the present invention includes an RF transmitter 522, MR signal detection circuitry 524, transmitter coils 526 and a SA antenna 100 according to the present invention. The RF transmitter 522 is under the control of the computer 506 so that RF field pulses or signals are selectively generated and applied to the body transmit coil for excitation of magnetic resonance in the body. While these RF excitation pulses are being applied to the body, T/R switches 224 (FIG. 10A) of the MR signal detection circuitry 524 are actuated so as to de-couple the SA antenna 100 from the MR signal detection circuitry.

Following application of the RF excitation pulses, the T/R switches 224 are again actuated to couple the SA antenna 100 to the MR signal detection circuitry 524. The SA antenna 100 detects or senses the MR signals resulting from the excited nuclei in the body and conducts the MR signals onto the MR signal detection circuitry 524 (e.g., the receivers 230 thereof). These detected MR signals are in turn passed onto the imager 514. The imager 514, under the control of the computer 506, processes the signals to produce signals representing an image of a region of interest in the body 2. These processed signals are sent onto a display device 516 to provide a visual display of the image.

In operation, the uniform magnetic field $B_o$ generated by the main magnet 502 is applied to the body 2 by convention along the Z-axis of a Cartesian coordinate system, the origin of which is at the center of the magnet and typically near or within the region of interest being imaged in the object. The uniform magnetic field $B_o$ being applied has the effect of aligning the nuclear magnetization of the nuclei in the body 2, along the Z-axis. In response to RF pulses of the proper frequency being generated by the RF transmitter 522, that are orientated within the XY plane, the nuclei resonate at their Larmor frequencies, producing a time-dependent XY magnetization at the NMR frequency which can be detected by a SA antenna with strips with long axes substantially orthogonal to the XY plane. In one typical imaging sequence, the RF signal centered about the desired Larmor frequency is applied to the body 2 at the same time a magnetic field gradient $G_z$ is being applied along the Z-axis by means of the gradient control sub-system 510. This gradient field $G_z$ causes only the nuclei in a slice with a limited width through the body 2 along the XY plane, to have the resonant frequency and to be excited into resonance, a process typically referred to as selective excitation.

After excitation of the nuclei in the slice, magnetic field gradients are applied along the X- and Y-axes respectively. The gradient $G_x$ along the X-axis causes the nuclei to precess at different frequencies depending on their position along the X-axis, that is, $G_x$ spatially encodes the precessing nuclei by frequency (i.e., frequency encoding). The Y-axis gradient $G_y$ is incremented through a series of values and encodes the Y position into the rate of change of the phase of the precessing nuclei as a function of gradient amplitude, a process typically referred to as phase encoding. Phase-encoding can be extended to more than one dimensions for example, by replacing selective excitation of the single slice using a $G_z$ gradient pulse applied during excitation as described above, with Z-gradient incrementation after the excitation. By such means full three-dimensional (3D) volume imaging is achieved, for example, by phase-encoding in two dimensions (Z, Y) and applying frequency encoding in the third dimension (X).

The SA detector of the present invention can also be beneficially utilized with a number of serial or parallel encoding techniques, such as SMASH, SENSE or ASP noted above, wherein the non-uniform spatial sensitivity of the SA antenna can be used to spatially encode an image and thereby eliminate otherwise essential phase-encoding steps. Because the phase-encoding steps in the one or more dimensions are otherwise performed serially, elimination of phase-encoding steps with replacement by sensitivity encoding permits dramatic reduction—even decimation of the scan time. The maximum reduction factor, or minimum scan time or acceleration factor depends in part on the number of detectors that are providing the parallel encoding information. Because the SA antenna 100 of the present invention is much less prone to coupling problems endemic to prior art loop arrays, and because a broad range of strip spacing is possible, very large numbers of conductor strips 140 can be deployed without significant coupling problems, permitting very large acceleration or time-reduction factors, and therefore very high-speed MRI or NMR. However, the SA antenna 100 of the present invention can of course be used in conventional serial encoding phased-array MRI to acquire an image.

Although a preferred embodiment of the invention has been described using specific terms, such description is for illustrative purposes only, and it is to be understood that changes and variations may be made without departing from the spirit or scope of the following claims.

What is claimed is:

1. A device for detecting near field electromagnetic signals, comprising a strip array antenna, wherein the strip array antenna includes:
   a plurality of conductors being arranged so a long axis of each is in parallel and spaced from each other, each of the plurality of conductors having a length,
   a plurality of reactive tuning components, at least one of said plurality of reactive tuning components being electrically coupled to each conductor and to one of ground or virtual ground, and
   wherein the length of each conductor and a value of each reactive tuning component are set so an apparent electrical length of each conductor is equal to be about $n\lambda/4$, where n is an integer $\geq 1$ and $\lambda$ is the wavelength of the signal to be detected.

2. The detection device of claim 1, wherein the length of each of the plurality of conductors is further selected so as optimize SNR of the near-field electromagnetic signals detected from a desired region of interest.

3. The detection device of claim 2, wherein the length L of each conductor, is further chosen for the detection of signals at distances or depths d from the detector such that $0.5d \leq L \leq 5d$.

4. The detection device of claim 1, wherein the reactive tuning component is a capacitor.

5. The detection device of claim 1, wherein the near-field electromagnetic signals are magnetic resonance (MR) signals from a region of interest in a sample undergoing MR evaluation.

6. The detection device of claim 1, wherein the conductors are configured and arranged so as to form one of a planar strip array, a curved strip array, flexible strip array or a cylindrical strip array.

7. The detection device of claim 6 wherein said ground for a cylindrical strip array includes a plurality of ground plane members with one ground plane member for each conductor, and wherein the spaces between at least two of the said plurality of ground plane members and their corresponding conductors is left open to provide space for air, and/or permit viewing through the detection device.

8. The detection device of claim 6, wherein said ground for a cylindrical strip array includes a plurality of ground plane members with one ground plane member for each conductor, and wherein a transparent substrate is disposed between each conductor and its corresponding ground plane member to permit viewing through the detection device in the space between adjacent conducting members.

9. The detection device of claim 6, wherein the plurality of conductors of the cylindrical strip array are arranged so as to extend along the cylindrical axis thereof.

10. The detection device of claim 6, wherein the plurality of conductors of the cylindrical strip array are arranged so that each conductor extends circumferentially.

11. The detection device of claim 10, wherein each circumferentially extending conductor is arranged so as to form a continuous loop.

12. The detection device of claim 11, wherein each circumferential continuous loop includes match and tune circuitry to couple signals detected in each loop out of each loop.

13. The detection device of claim 10, wherein each circumferential continuous loop includes circuitry to deactivate the loop during magnetic resonance excitation.

14. The detection device if claim 1, further comprising a plurality of reactive coupling elements, where at least one of the plurality of reactive coupling components is electrically connected between and to adjacent conductors.

15. The detection device of claim 14, wherein a value of each of said plurality of reactive coupling elements is set so as to substantially reduce coupling of a signal in one of said plurality of conductors to an adjacent conductor(s).

16. The detection device of claim 14, wherein each of said plurality of reactive coupling elements is a capacitor.

17. The detection device of claim 1, wherein:
said one of ground or virtual ground is formed by one of a ground plane or a plurality of ground plane members, one ground plane member for each of said plurality of conductors, said ground plane and said plurality of ground plane members being at one of ground or virtual ground; and
said at least one of said plurality of reactive tuning components is electrically coupled to each conductor and to one of the ground plane or the ground plane member that corresponds to said each conductor.

18. The detection device of claim 17, wherein spaces between at least two of said plurality of ground plane members that comprise said one or ground or virtual ground and their corresponding conductors is left open to provide space for air, and/or permit viewing through the detection device.

19. The detection device of claim 1, wherein a plurality of reactive tuning components are electrically coupled between and to each conductor and the one of ground or virtual ground.

20. The detection device of claim 17, further comprising:
a substrate arranged so as to be disposed between the ground plane that comprises said one of ground and virtual ground and the plurality of conductors.

21. The detection device of claim 17, further comprising:
a plurality of substrate members arranged so one of said plurality of substrate members is disposed between each conductor and said one of the ground plane or the ground plane member that corresponds to said each conductor.

22. The detection device of claim 1, further comprising an encapsulation member, wherein the encapsulation member includes:
a substrate, upon one surface of which is disposed the plurality of conductors,
a ground plane that is disposed on an opposing surface of the substrate, said ground plane forming said one of ground or virtual ground,
an overlay that covers the conductors disposed on the substrate; and
wherein the plurality of reactive tuning components are electrically coupled to the ground plane such that said at least one of said plurality of reactive tuning components is electrically connected between each conductor and the ground plane.

23. The detection device of claim 1, further comprising an encapsulation member, wherein the encapsulation member includes:

a substrate, upon one surface of which is disposed the plurality of conductors,
a plurality of ground plane members that are disposed on an opposing surface of the substrate, each of said plurality of ground plane members forming said one of ground or virtual ground,
an overlay that covers the conductors disposed on the substrate; and
wherein said at least one of said plurality of reactive tuning components is electrically connected between each conductor and the ground plane member that corresponds to said each conductor.

24. The detection device of claim 1, wherein the spacing of each conductor is set so as to provide sensitive detection of signals across the plurality of conductors perpendicular to the plurality of conductors, and to substantially reduce coupling of a signal in one of the plurality of conductors to an adjacent conductor(s).

25. The detection device of claim 24, wherein the spacing s of each conductor, is further chosen to fall in a range $L/10 \leq s \leq 2L$, where L is the length of each of said plurality of conductors.

26. The detection device of claim 1, wherein n is an odd integer and wherein said detection device further comprises a termination mechanism operably connected to one end of each conductor and configured so as to terminate each of said one end as one of a short circuit or an open circuit.

27. The detection device of claim 26, wherein the termination mechanism is configured so said one end of the plurality of conductors is alternately terminated as the short circuit and the open circuit.

28. The detection device of claim 21, wherein:
each conductor includes a first end and a second end;
the first end of each odd numbered conductor of the strip array antenna is terminated as one of the short circuit or the open circuit;
the second end of each even numbered conductor of the strip array antenna is terminated as one of the short circuit or the open circuit.

29. The detection device of claim 28, wherein all first ends are terminated as one of the short circuit or the open circuit and all second ends are terminated as the other of the short circuit or the open circuit.

30. The detection device of claim 1, wherein one end of each conductor is terminated with a resistive match and wherein n is an even integer.

31. The detection device of claim 30, wherein the resistive match is formed from reactive circuit elements.

32. The detection device of claim 1, further comprising an electromagnetic guard mechanism being arranged so that the guard mechanism significantly isolates at least a portion of the strip array antenna from electromagnetic interference from signals derived from outside the sensitive region of the detector.

33. The detection device of claim 32, wherein the guard mechanism comprises a plurality of guard elements, and wherein the plurality of guard elements are arranged such that one of said plurality of guard elements is disposed in proximity to each end of the strip array antenna to significantly isolate ends of the strip array antenna.

34. The detection device of claim 33, wherein the plurality of guard elements are further arranged such that one of said plurality of guard elements is disposed along and in proximity to each side of the strip array antenna to isolate the sides and ends of the strip array antenna.

35. The detection device of claim 32, wherein the guard mechanism comprises a plurality of guard elements, and wherein the plurality of guard elements are arranged such that one of said plurality of guard elements is disposed in proximity to and along each side of the strip array antenna to isolate sides of the strip array antenna.

36. The detection device of claim 32, wherein the guard mechanism is electrically grounded.

37. The detection device of claim 32, wherein the near-field electromagnetic signals are magnetic resonance (MR) signals from a region of interest in a sample undergoing MR evaluation and wherein the guard mechanism includes circuitry configured and arranged to deactivate the guard mechanism during magnetic resonance excitation.

38. The detection device of claim 32, wherein:
the conductors are configured and arranged so as to form a cylindrical strip array having a cylinder axis, and
the guard mechanism comprises a plurality of guard elements, wherein the plurality of guard elements are arranged so one of the plurality of guard element is disposed in a plane that is essentially perpendicular to the cylinder axis and is one of in proximity to each end of the cylindrical strip array, when the conductors are arranged so as to be parallel to the cylinder axis or in proximity to each side of the cylindrical strip array when the conductors extend at least partially circumferentially about the cylinder axis.

39. The detection device of claim 38 wherein said guard elements that are disposed in said plane essentially perpendicular to the cylinder axis form circumferential loops.

40. The detection device of claim 38 wherein said plurality of guard elements further includes guard elements that are arranged so as to be parallel to the cylinder axis and are disposed in proximity to the first and last conductors, in the case when the conductors of the cylindrical strip array are arranged so as to be parallel to the cylinder axis and the conductors extend only partially circumferentially about the cylinder axis.

41. The detection device of claim 38, wherein the near-field electromagnetic signals are magnetic resonance (MR) signals from a region of interest in a sample undergoing MR evaluation and wherein the guard mechanism includes circuitry configured and arranged to deactivate the guard mechanism during magnetic resonance excitation.

42. The detection device of claim 1, wherein a number of parallel conductors comprising the strip array antenna is one of 4 or more conductors, 16 or more conductors, 32 or more conductors, in the range of from 4 to 16 conductors, in the range of from 4 to 32 conductors, or in the range of from 16–32 conductors.

43. The detection device of claim 20, wherein the substrate is flexible.

44. The detection device of claim 1, wherein each of said plurality of conductors and said one of ground or virtual ground are formed from at least one of copper, silver, gold, a super-conducting material, or a material coated with one of copper, silver, gold, or a super-conducting material.

45. The detection device of claim 44, where each of said plurality of conductors and said one of ground or virtual ground are formed from one of a super-conducting material or a material coated with or a super-conducting material ansd wherein said strip array is configured and arranged so as to be is cryostatically encapsulated to maintain the super-conducting properties.

46. The detection device of claim 1, wherein one of said plurality of conductors, said one of ground or virtual ground or said plurality reactive tuning components is formed from a printed circuit board.

47. The detection device of claim 1 wherein:
one end of each one of the plurality of conductors is connected to termination circuity, and
the other end of each one of the plurality of conductors is connected to matching and tuning means.

48. The detection device of claim 47 further including transmit/receive switching means connected to said matching and tuning means.

49. The detection device of claim 48 further including preamplifier means connected to said transmit/receive switching means.

50. The detection device of claim 49 further including receiver means connected to said preamplifier means.

51. The detection device of claim 1, wherein each of said plurality of conductors includes at least one conducting element having an element length and at least one inductive element electrically coupled thereto and wherein the element length, a value of each reactive tuning component and a value of each of said at least one inductive element are set so an apparent electrical length of each conductor is equal to be about $n\lambda/4$, where n is an integer$\geq 1$ and $\lambda$ is the wavelength of the signal to be detected.

52. A device for detecting near field electromagnetic signals, comprising a strip array antenna, wherein the strip array antenna includes:
a plurality of conductors arranged so a long axis of each is in parallel and spaced from each other, wherein each of said plurality of conductors includes at least one conducting element having an element length;
a plurality of inductive elements at least one inductive element being electrically coupled to said at least one conducting element of each of said plurality of conductors; and
wherein the element length of said at least one conducting element, and a value of said at least one inductive element electrically coupled thereto are set so an apparent electrical length of each of said plurality of conductors is equal to be about $n\lambda/4$, where n is an integer$\geq 1$ and $\lambda$ is the wavelength of the signal to be detected.

53. The detection device of claim 52, further comprising a plurality of reactive tuning components, at least one of said plurality of reactive tuning components being electrically coupled to said at least one conducting element and to one of ground or a ground plane such that said at least one of said plurality of reactive tuning components is electrically connected between said at least one conducting element of each of said plurality of conductors and said one of ground or virtual ground; and
wherein the element length, a value of said at least one of said plurality of reactive tuning components and a value of each of said at least one inductive element for each of said plurality of conductors are set so an apparent electrical length of each of said plurality of conductors is equal to be about $n\lambda/4$, where n is an integer$\geq 1$ and $\lambda$ is the wavelength of the signal to be detected.

54. The detection device of claim 52, wherein:
each of said plurality of conductors includes a plurality of conducting elements each having an element length;
said at least one inductive element is electrically coupled between a pair of said plurality of conducting elements; and
a total of the element length for said plurality of conducting elements and a value of each of said at least one inductive element for each of said plurality of conductors are set so an apparent electrical length of said each of said plurality of conductors is equal to be about nλ/4, where n is an integer≧1 and λ is the wavelength of the signal to be detected.

55. The detection device of claim 54, further comprising a plurality of reactive tuning components, at least one of said plurality of reactive tuning components being electrically coupled to said at least one conducting element and to one of ground or a ground plane such that said at least one of said plurality of reactive tuning components is electrically connected between said at least one conducting element of each of said plurality of conductors and said one of ground or virtual ground; and wherein a total of the element length for said plurality of conducting elements, a value of said at least one of said plurality of reactive tuning components and a value of each of said at least one inductive element for each of said plurality of conductors are set so an apparent electrical length of each of said plurality of conductors is equal to be about nλ/4, where n is an integer≧1 and λ is the wavelength of the signal to be detected.

56. An NMR or MRI system comprising:
a magnet,
gradient magnetic field coil means
gradient coil supply means,
RF transmit means,
gradient and RF control means,
NMR receiver means, and
a detection device that detects MR/NMR signals from a region of interest in a sample undergoing NMR or MRI, said detection device comprising a strip array antenna that includes:
   a plurality of conductors being arranged so a long axis of each is in parallel and spaced from each other, each of the plurality of conductors having a length,
   a plurality of reactive tuning components, at least one of said plurality of reactive tuning components being electrically coupled to each conductor and to one of ground or virtual ground, and
   wherein the length of each conductor and a value of each reactive tuning component are set so an apparent electrical length of each conductor is equal to be about nλ/4, where n is an integer≧1 and λ is the wavelength of the MR/NMR signals to be detected.

57. The detection device of claim 56, wherein the length of each of the plurality of conductors is further selected so as optimize SNR of the MR/NMR signals detected from the desired region of interest.

58. The system of claim 56 wherein at least the detection device is configured and arranged to detect hydrogen (¹H) NMR signals.

59. The system of claim 56 wherein at least the detection device is configured and arranged to detect NMR signals from nuclei other than hydrogen.

60. An NMR or MRI system comprising:
a magnet,
gradient magnetic field coil means
gradient coil supply means,
RF transmit means,
gradient and RF control means,
NMR receiver means, and
a detection device that detects MR/NMR signals from a region of interest in a sample undergoing NMR or MRI, said detection device comprising a strip array antenna that includes:
   a plurality of conductors arranged so a long axis of each is in parallel and spaced from each other, wherein each of said plurality of conductors includes at least one conducting element having an element length,
   a plurality of inductive elements at least one inductive element being electrically coupled to said at least one conducting element of each of said plurality of conductors, and
   wherein the element length of said at least one conducting element, and a value of said at least one inductive element electrically coupled thereto are set so an apparent electrical length of each of said plurality of conductors is equal to be about nλ/4, where n is an integer≧1 and λ is the wavelength of the signal to be detected.

61. The system of claim 59 wherein said strip array antenna further includes
a plurality of reactive tuning components, at least one of said plurality of reactive tuning components being electrically coupled to said at least one conducting element and to one of ground or a ground plane such that said at least one of said plurality of reactive tuning components is electrically connected between said at least one conducting element of each of said plurality of conductors and said one of ground or virtual ground; and wherein the element length, a value of said at least one of said plurality of reactive tuning components and a value of each of said at least one inductive element for each of said plurality of conductors are set so an apparent electrical length of each of said plurality of conductors is equal to be about nλ/4, where n is an integer≧1 and λ is the wavelength of the signal to be detected.

62. The system of claim 60, wherein said plurality of conductors are further arranged so as to form a cylindrical strip array in which each of the plurality of conductors extend along a cylinder axis thereof.

63. The system of claim 60, wherein said plurality of conductors are further arranged so as to form a cylindrical strip array in which each of the plurality of conductors extend circumferentially about a cylinder axis thereof.

64. The system of claim 63, wherein each circumferentially extending conductor is arranged so as to form a continuous loop.

65. The system of claim 60, wherein said strip array antenna is configured and arranged so as to form a flexible strip array antenna.

66. The system of claim 60 wherein at least the detection device is configured and arranged to detect hydrogen (¹H) NMR signals.

67. The system of claim 60 wherein at least the detection device is configured and arranged to detect NMR signals from nuclei other than hydrogen.

68. A method of NMR comprising the steps of:
placing a sample of interest in an NMR scanner,
exciting NMR signal in at least one region of said sample;
providing a detection device that detects NMR signals, said detection device comprising a strip array antenna that includes:
   a plurality of conductors being arranged so a long axis of each is in parallel and spaced from each other, each of the plurality of conductors having a length,
   a plurality of reactive tuning components, at least one of said plurality of reactive tuning components being electrically coupled to each conductor and to one of ground or virtual ground, and wherein the length of each conductor and a value of each reactive tuning component are set so an apparent electrical length of each conductor is equal to be about $n\lambda/4$, where n is an integer$\geq 1$ and $\lambda$ is the wavelength of the MR/NMR signals to be detected; and detecting signals from said at least one region using said detection system.

69. A method of NMR comprising the steps of:

placing a sample of interest in an NMR scanner, selectively exciting NMR signal in at least one region of said sample;

providing a detection system that detects NMR signals, said detection system including a strip array antenna that includes:
- a plurality of conductors arranged so a long axis of each is in parallel and spaced from each other, wherein each of said plurality of conductors includes at least one conducting element having an element length,
- a plurality of inductive elements at least one inductive element being electrically coupled to said at least one conducting element of each of said plurality of conductors, and
- wherein the element length of said at least one conducting element, and a value of said at least one inductive element electrically coupled thereto are set so an apparent electrical length of each of said plurality of conductors is equal to be about $n\lambda/4$, where n is an integer$\geq 1$ and $\lambda$ is the wavelength of the signal to be detected; and detecting signals from said at least one region using said detection device.

70. A method for MRI comprising the steps of:

putting a sample of interest in an imager of an MRI system;

applying a transverse RF excitation field tuned to a resonant frequency in the sample;

applying magnetic field gradients in at least one of the X, Y or Z directions so as to cause nuclei to be encoded according to their position in the sample;

providing a detection system that detects MR signals, said detection system including a strip array antenna that includes:
- a plurality of conductors being arranged so a long axis of each is in parallel and spaced from each other, each of the plurality of conductors having a length,
- a plurality of reactive tuning components, at least one of said plurality of reactive tuning components being electrically coupled to each conductor and to one of ground or virtual ground, and
- wherein the length of each conductor and a value of each reactive tuning component are set so an apparent electrical length of each conductor is equal to be about $n\lambda/4$, where n is an integer$\geq 1$ and $\lambda$ is the wavelength of the MR/NMR signals to be detected;

detecting MR signals using said detection system; and processing the MR signals and reconstructing an image from the processed signals.

71. The MRI method of claim 68, further comprising the step of displaying the reconstructed image.

72. The MRI method of claim 69 wherein the detection system is used for parallel sensitivity encoding and wherein said processing and reconstructing includes generating images from said NMR signals using a parallel sensitivity encoding technique.

73. The MRI method of claim 70, wherein the sample of interest is a portion of a body.

74. The MRI method of claim 70, wherein said MRI system comprises a magnet, gradient magnetic field coil means, gradient coil supply means, RF transmit means, and gradient and RF control means.

75. A method for MRI comprising the steps of:

putting a sample of interest in an imager of an MRI system;

applying transverse RF excitation field tuned to a resonant frequency in the sample;

applying magnetic field gradients in at least one of the X, Y or Z directions so as to cause nuclei to be encoded according to their position in the sample;

providing a detection system that detects MR signals, said detection system including a strip array antenna that includes:
- a plurality of conductors arranged so a long axis of each is in parallel and spaced from each other, wherein each of said plurality of conductors includes at least one conducting element having an element length,
- a plurality of inductive elements at least one inductive element being electrically coupled to said at least one conducting element of each of said plurality of conductors, and
- wherein the element length of said at least one conducting element, and a value of said at least one inductive element electrically coupled thereto are set so an apparent electrical length of each of said plurality of conductors is equal to be about $n\lambda/4$, where n is an integer$\geq 1$ and $\lambda$ is the wavelength of the signal to be detected;

detecting MR signals using said detection system, and processing the MR signals and reconstructing an image from the processed signals.

76. The MRI method of claim 75, further comprising the step of displaying the reconstructed image.

77. The MRI method of claim 75 wherein the MRI system and the detection system are configured so as to be used for parallel sensitivity encoding and wherein said processing and reconstructing includes processing the MR signals and reconstructing an image from the processed signals using a parallel sensitivity encoding technique.

78. The MRI method of claim 75, wherein the sample of interest is a portion of a body.

79. The MRI method of claim 75, wherein said MRI system comprises a magnet, gradient magnetic field coil means, gradient coil supply means, RF transmit means, and gradient and RF control means.

* * * * *